(12) United States Patent
Gotham et al.

(10) Patent No.: US 10,248,169 B2
(45) Date of Patent: Apr. 2, 2019

(54) HOUSING COMPONENTS FOR ELECTRONIC DEVICES

(71) Applicant: Apple Inc., Cupertino, CA (US)

(72) Inventors: Todd F. Gotham, Campbell, CA (US); Andrew David Lauder, Oxford (GB); Tang Yew Tan, San Francisco, CA (US); Erik L. Wang, Redwood City, CA (US); Phillip Michael Hobson, Menlo Park, CA (US); Richard Hung Minh Dinh, Saratoga, CA (US); Christopher Stringer, Woodside, CA (US); Richard Howarth, San Francisco, CA (US); John Ternus, Los Altos Hills, CA (US); Rico Zorkendorfer, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/402,465

(22) Filed: Jan. 10, 2017

(65) Prior Publication Data
US 2017/0147041 A1    May 25, 2017

Related U.S. Application Data

(63) Continuation of application No. 14/317,858, filed on Jun. 27, 2014, now Pat. No. 9,552,022, which is a continuation of application No. 12/186,990, filed on Aug. 6, 2008, now Pat. No. 8,776,358.

(60) Provisional application No. 60/963,769, filed on Aug. 6, 2007.

(51) Int. Cl.
*G06F 1/16* (2006.01)
*H05K 5/00* (2006.01)
*H05K 7/00* (2006.01)
*G06F 1/18* (2006.01)
*H05K 5/02* (2006.01)
(Continued)

(52) U.S. Cl.
CPC ............ *G06F 1/181* (2013.01); *G06F 1/1601* (2013.01); *G06F 1/1684* (2013.01); *H04R 3/00* (2013.01); *H05K 5/02* (2013.01); *H05K 5/0243* (2013.01); *H04R 1/08* (2013.01); *Y10T 29/49002* (2015.01); *Y10T 29/5116* (2015.01)

(58) Field of Classification Search
CPC .......... G06F 1/1601; G06F 1/18; G06F 1/181; G06F 1/1684; G06F 1/1626; G06F 1/1633; G06F 1/1637; G06F 1/1613; H05K 5/02; H05K 5/0243
USPC .............. 361/679.21–679.3, 679.55, 679.56; 455/575.1–575.9; 349/56–60
See application file for complete search history.

(56) References Cited

U.S. PATENT DOCUMENTS

| | | |
|---|---|---|
| 3,636,236 A | 1/1972 | Smith |
| 4,480,175 A | 10/1984 | Brasky |
| 4,572,851 A | 2/1986 | Fortuna |

(Continued)

*Primary Examiner* — Anthony M Haughton
(74) *Attorney, Agent, or Firm* — Brownstein Hyatt Farber Schreck, LLP

(57) ABSTRACT

Electronic devices are provided with a protective housing having one or more housing components. A housing component can be formed from a single sheet of material to appear as if the housing component had been formed from a hollowed out solid block of material. The sheet of material may be deep drawn, forged, and machined to form the housing component. One or more holes may be formed through a portion of the housing component to provide an I/O interface.

18 Claims, 19 Drawing Sheets

(51) Int. Cl.
   *H04R 3/00*   (2006.01)
   *H04R 1/08*   (2006.01)

(56) References Cited

U.S. PATENT DOCUMENTS

| | | | |
|---|---|---|---|
| 4,964,018 A | 10/1990 | Mallory et al. | |
| 5,574,625 A * | 11/1996 | Ohgami | G06F 1/1626 312/223.2 |
| 5,579,939 A | 12/1996 | Bourassa | |
| 5,706,160 A | 1/1998 | Latuszkin et al. | |
| 5,720,101 A | 2/1998 | Foley et al. | |
| 5,775,159 A | 7/1998 | Schroter et al. | |
| 5,831,816 A * | 11/1998 | Johns | F16M 11/10 349/60 |
| 6,184,468 B1 | 2/2001 | Speziale | |
| 6,288,329 B1 | 9/2001 | Kopp et al. | |
| 6,307,742 B1 | 10/2001 | Diaz et al. | |
| 6,418,014 B1 | 7/2002 | Emerick, Jr. | |
| 6,650,528 B2 | 11/2003 | Schmid et al. | |
| 6,808,079 B2 | 10/2004 | Lalancette et al. | |
| 6,979,780 B1 | 12/2005 | Lalancette | |
| 7,265,988 B2 | 9/2007 | Quijano | |
| 7,397,659 B1 * | 7/2008 | Curran | G06F 1/1632 361/679.41 |
| 7,626,814 B2 * | 12/2009 | Seibert | G06F 1/1635 361/679.32 |
| 7,983,034 B1 | 7/2011 | Mohoney et al. | |
| 8,186,726 B2 * | 5/2012 | Zuo | H04M 1/0274 292/1 |
| 8,199,470 B2 * | 6/2012 | Yang | H05K 5/0239 361/679.02 |
| 8,358,499 B2 | 1/2013 | Jacobs et al. | |
| 8,611,077 B2 | 12/2013 | Sanford et al. | |
| 8,649,166 B2 | 2/2014 | Wu et al. | |
| 8,665,585 B2 * | 3/2014 | Ko | H04M 1/0274 361/679.02 |
| 8,896,994 B2 | 11/2014 | Abe et al. | |
| 8,926,345 B2 * | 1/2015 | Kim | G06K 13/0825 439/142 |
| 8,929,067 B2 | 1/2015 | Wu et al. | |
| 9,196,994 B2 * | 11/2015 | Tseng | H01R 13/5213 |
| 2005/0036283 A1 | 2/2005 | Hillman | |
| 2006/0063420 A1 | 3/2006 | Reibke et al. | |
| 2006/0290491 A1 | 12/2006 | Wagner et al. | |
| 2008/0024470 A1 | 1/2008 | Andre et al. | |
| 2008/0084404 A1 | 4/2008 | Andre et al. | |
| 2009/0091879 A1 | 4/2009 | Lim | |
| 2012/0044624 A1 | 2/2012 | Hoffman et al. | |
| 2013/0027862 A1 | 1/2013 | Rayner et al. | |
| 2014/0111929 A1 | 4/2014 | Andre et al. | |

* cited by examiner

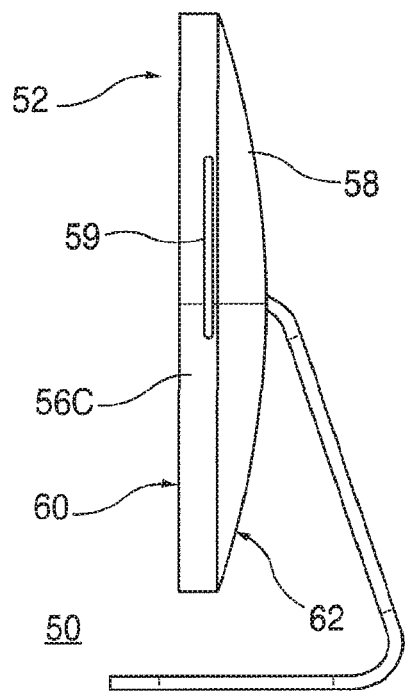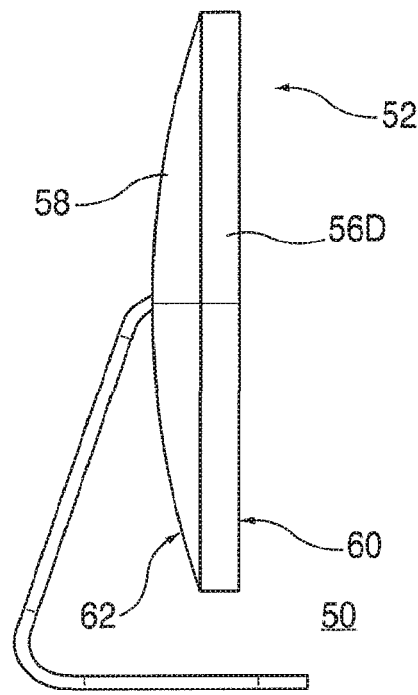
FIG. 6  FIG. 7
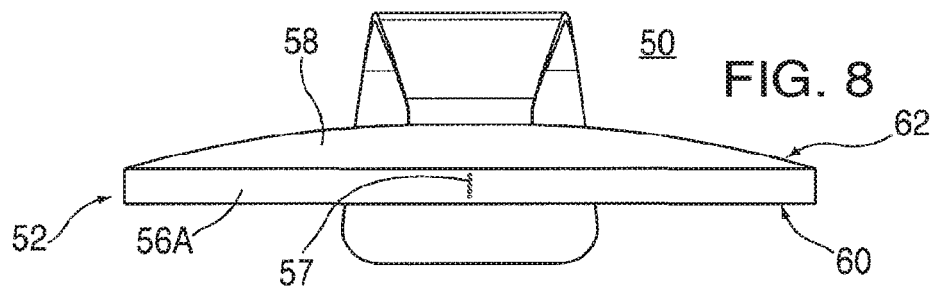
FIG. 8
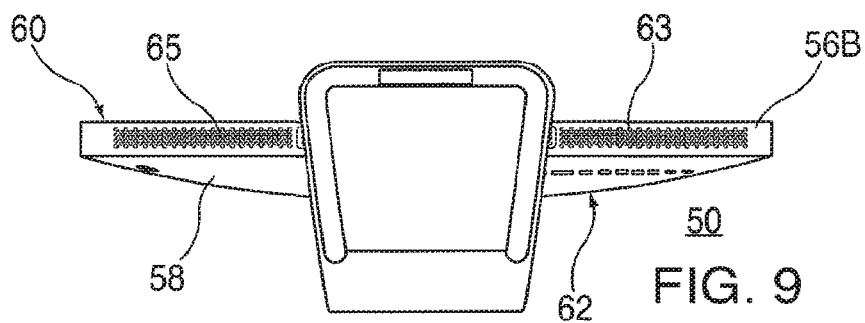
FIG. 9

HOUSING COMPONENTS FOR ELECTRONIC DEVICES

CROSS-REFERENCE TO RELATED APPLICATIONS

This application is a continuation patent application of U.S. patent application Ser. No. 14/317,858, filed Jun. 27, 2014 and titled "Housing Components for Electronic Devices," which is a continuation patent application of U.S. patent application Ser. No. 12/186,990, filed Aug. 6, 2008 and titled "Housing Components for Electronic Devices," now U.S. Pat. No. 8,776,358, which claims the benefit of U.S. Provisional Patent Application No. 60/963,769, filed Aug. 6, 2007 and titled "Bezel for Electronic Device,", which is the disclosures of which are hereby incorporated by reference herein in their entireties.

FIELD OF THE INVENTION

This can relate to housing components for electronic devices and methods for constructing the same.

BACKGROUND OF THE DISCLOSURE

Some known electronic devices (e.g., computers and telephones) include at least one internal electronic component associated with the operation of the device and a protective housing that at least partially encloses the internal electronic component. Typically, the housing includes one or more housing components that serve to surround the internal electronic components at a peripheral region of the electronic device so as to cover and protect the internal components from adverse conditions.

Cosmetic features are important to consumers of electronic devices, as these features help create the overall impression that one has of the electronic device. Therefore, the housing may also be configured to form and aesthetically enhance the outward appearance of the electronic device. For example, the shape, contours, and/or color of the housing may be designed so as to create a positive impression about the electronic device, thereby contributing to the overall success of the device in the market place.

However, most known housings include multiple disconnected housing components that are joined together to surround the internal electronic components. The joining of multiple housing components traditionally create visible intersection locations, thereby making the outward appearance of the housing non-uniform.

Accordingly, what is needed are apparatus and methods for producing housing components of electronic devices that are aesthetically pleasing.

SUMMARY OF THE DISCLOSURE

Apparatus and methods for producing housing components of electronic devices are provided.

According to one embodiment of the invention, there is provided a method of forming a housing component for an electronic device with a sheet of material. The method includes drawing the sheet of material for creating a front wall and a first side wall extending from the front wall. The method also includes forging a first portion of the material towards the intersection of the front wall and the first side wall. The method may also include machining a second portion of the material at the intersection of the front wall and the first side wall.

According to another embodiment of the invention, there is provided a method of forming a housing component for an electronic device with a sheet of material having an external surface and an internal surface separated by a material thickness. The method includes punching a passageway through the sheet of material and between an external opening in the external surface and an internal opening in the internal surface. The method also includes forging a first portion of the material about the external opening to extend the passageway away from the external surface.

According to yet another embodiment of the invention, there is provided an electronic device that includes an electronic component and a housing component made from a sheet of material for protecting the electronic component. The housing component includes a front wall and a first side wall drawn from the sheet of material. The first side wall extends from an intersection with the front wall, and the intersection includes first material forged from the first side wall. The housing component may also include second material machined from the intersection.

According to yet still another embodiment of the invention, there is provided an electronic device that includes an electronic component and a housing component made from a sheet of material for protecting the electronic component. The sheet of material has an external surface and an internal surface separated by a material thickness. The housing component includes a passageway punched through the sheet of material and between an external opening in the external surface and an internal opening in the internal surface. The housing component further includes a first portion of the material forged about the external opening that extends the passageway away from the external surface.

BRIEF DESCRIPTION OF THE DRAWINGS

The above and other features of the invention, its nature, and various advantages will become more apparent upon consideration of the following detailed description, taken in conjunction with the accompanying drawings, in which like reference characters refer to like parts throughout, and in which:

FIG. 6 is a right side elevational view of the electronic device of FIGS. 2-5;

FIG. 7 is a left side elevational view of the electronic device of FIGS. 2-6;

FIG. 8 is a top view of the electronic device of FIGS. 2-7;

FIG. 9 is a bottom view of the electronic device of FIGS. 2-8;

DETAILED DESCRIPTION OF THE DISCLOSURE

Figure 1:
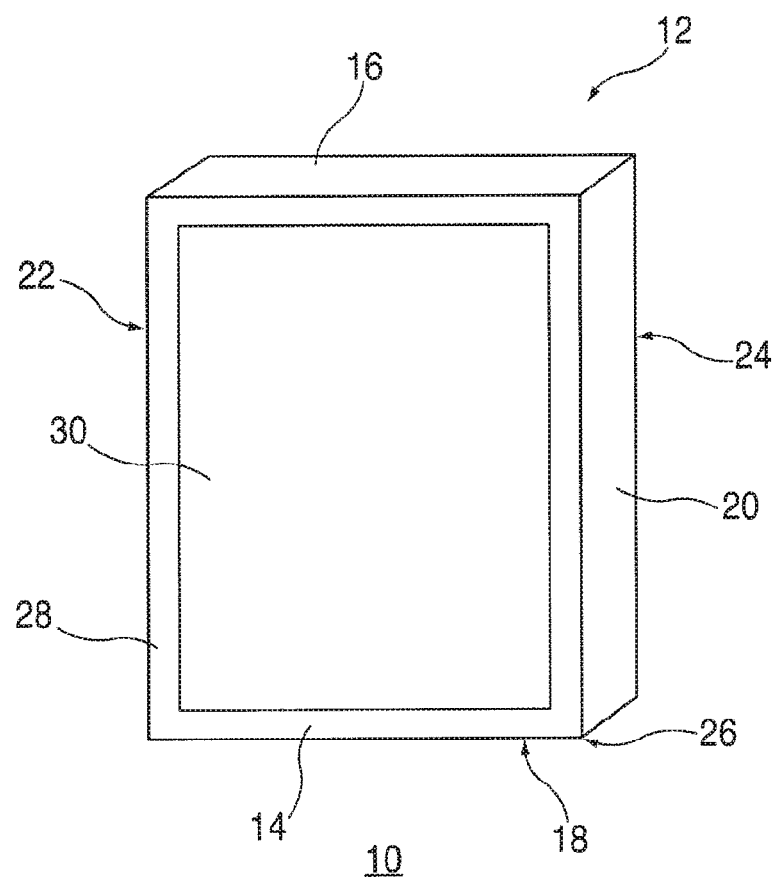
FIG. 1 is a top, front, right perspective view of an electronic device, in accordance with some embodiments of the invention.
Figure 2:
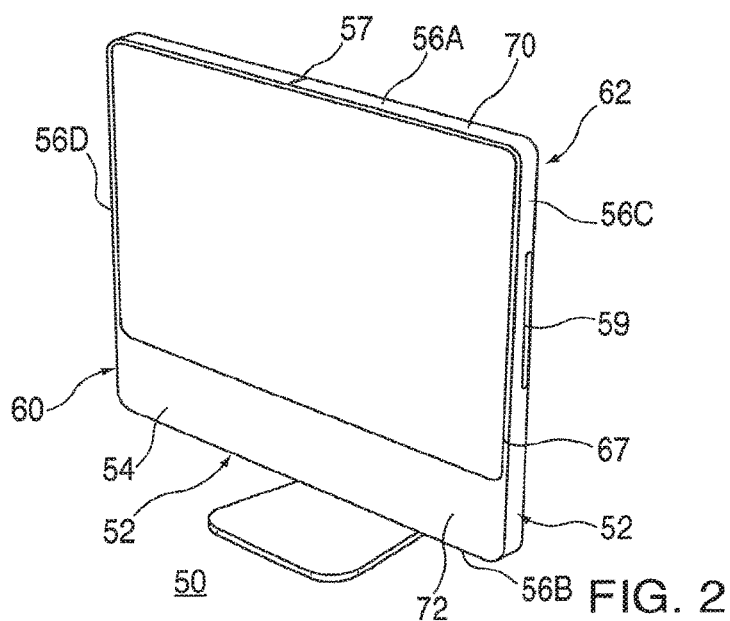
FIG. 2 is a top, front, right perspective view of an electronic device, in accordance with some embodiments of the invention.
Figure 3:
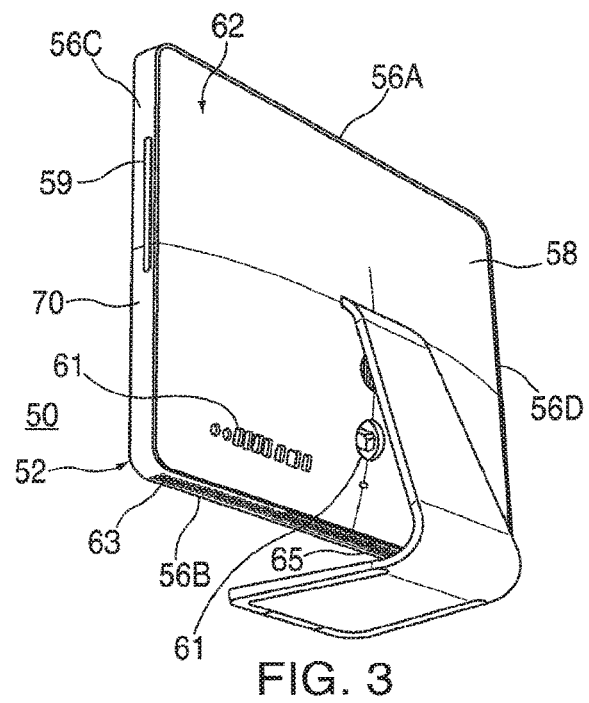
FIG. 3 is a bottom, rear, right perspective view of the electronic device of FIG. 2.
Figure 4:
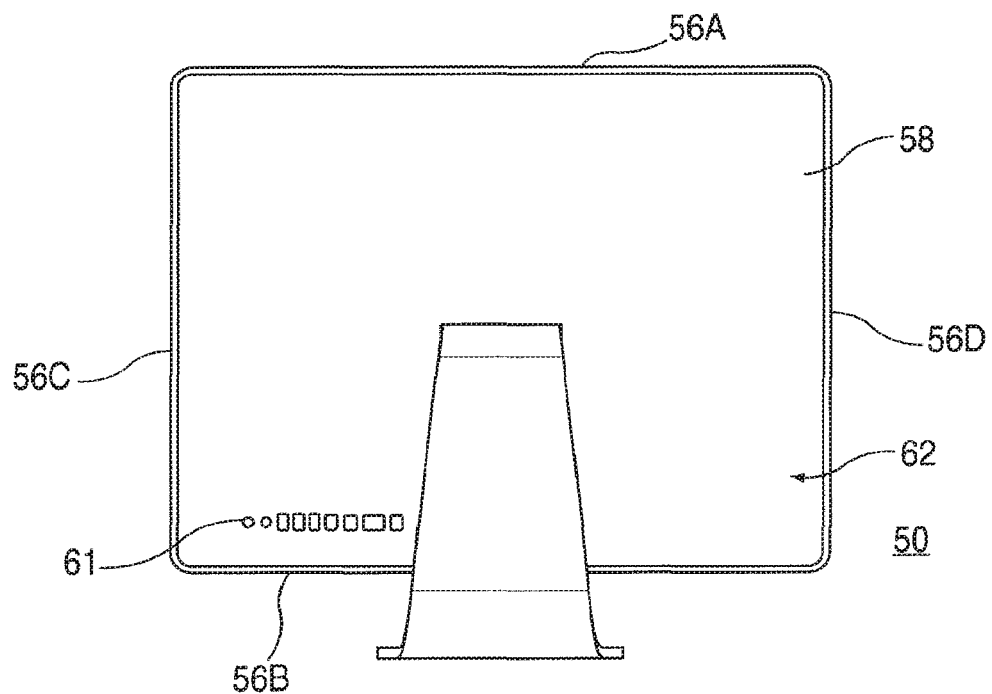
FIG. 4 is a rear elevational view of the electronic device of FIGS. 2 and 3.
Figure 5:
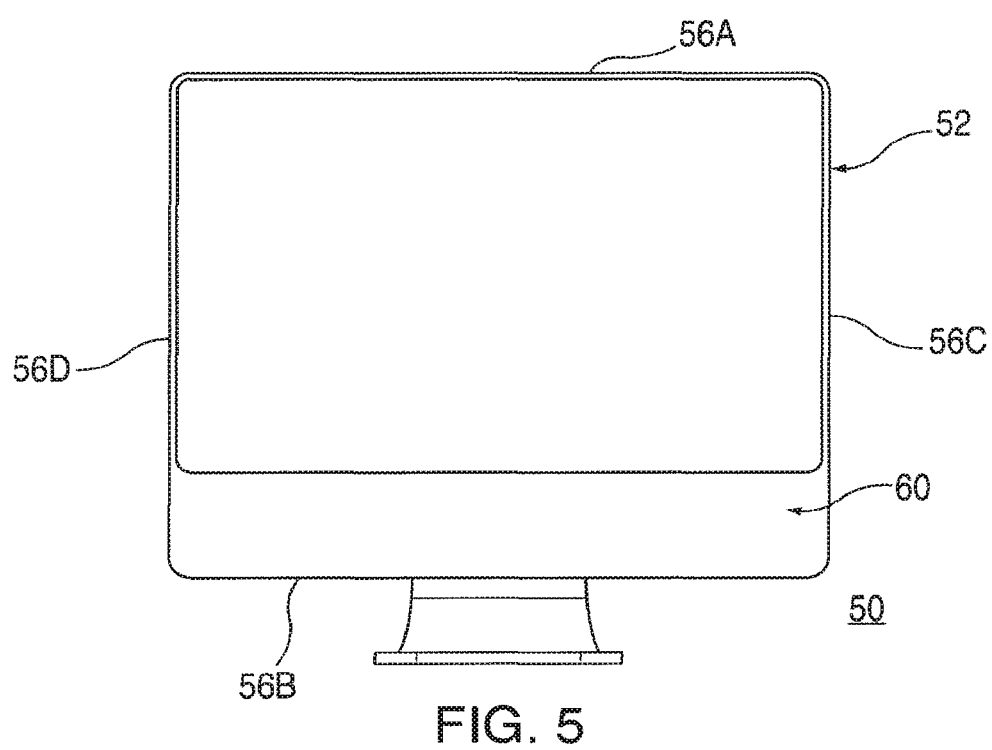
FIG. 5 is a front elevational view of the electronic device of FIGS. 2-4.

Apparatus and methods are provided for producing housings and housing components of electronic devices. In some embodiments, the housing may include at least one housing component formed from a single block of material. For example, a solid piece of metal or any other suitable block of material may be hollowed out to enclose one or more internal electronic components of the electronic device.

In other embodiments, however, the housing component may be configured to make the electronic device look as if the electronic device was formed from a single block of material. That is, although the housing component looks as though it was machined down from a large thick slab of material to give it its net shape, it may in fact be formed by other processes designed to mimic the machined look. For example, the housing component may be formed from a single piece of material, such as a single sheet of metal (e.g., flat stock aluminum).

In one embodiment, the shape of the housing component may be at least partially created by drawing and, more particularly, by deep drawing portions of the sheet of metal. Additionally or alternatively, the shape of the housing component may be at least partially created by forging portions of the sheet of metal. Additionally or alternatively, the shape of the housing component may be at least partially created by machining portions of the sheet of metal. In one specific example, a sheet of metal may be deep drawn to form a housing component with a front wall and side walls extending from the front wall (e.g., to form a box or can with one open end). Thereafter, portions of the housing component may be forged to affect its geometry at specific locations (e.g., to change the shape and/or thickness of the material at specific locations). Thereafter, portions of the housing component may be machined to form a near net shape. By utilizing sheet metal, for example, the overall cost of the part can be reduced (e.g., it is very expensive to machine down a large block of material as it wastes a lot of material and time).

The housing of the electronic device may include one or more housing components that provide a front wall and top, right side, left side, and bottom walls at the peripheral edge portions of the front wall. The front wall as well as the other walls may include various openings for input/output ("I/O") components or any other components associated with the electronic device. For example, the front wall may include an opening for a display of the electronic device. Therefore, another aspect of the invention relates to methods and apparatus for providing one or more holes at least partially through a housing component. These holes may create passageways for an I/O interface. For example, an I/O component may be positioned adjacent the inner surface of the housing component under one or more of the holes, thereby creating an I/O interface.

Apparatus and methods for producing housings and housing components of electronic devices are provided and described with reference to FIGS. 1-19.

FIG. 1 is a perspective diagram of a simplified electronic device 10 in accordance with one embodiment of the invention. The term "electronic device" can include, but is not limited to, music players, video players, still image players, game players, other media players, music recorders, video recorders, cameras, other media recorders, radios, medical equipment, domestic appliances, transportation vehicle instruments, calculators, cellular telephones, other wireless communication devices, personal digital assistants, remote controls, pagers, computers (e.g., desktops, laptops, tablets, servers, etc.), monitors, televisions, stereo equipment, set up boxes, set-top boxes, boom boxes, modems, routers, keyboards, mice, speakers, printers, and combinations thereof. In some cases, the electronic devices may perform a single function (e.g., a device dedicated to playing music) and, in other cases, the electronic devices may perform multiple functions (e.g., a device that plays music, displays video, stores pictures, and receives and transmits telephone calls).

Electronic device 10 may include a housing 12. Housing 12 may be configured to at least partially enclose one or more components associated with the operation of electronic device 10. Housing 12 may typically define a cavity within which various internal components can be placed. Housing 12 can also support various mechanisms, such as I/O mechanisms, at its surfaces or within openings through its surfaces. Housing 12 may also help to define the shape or form of electronic device 10. That is, the contour of housing 12 may embody the outward physical appearance of electronic device 10. In one embodiment, the housing may be formed in a flat panel configuration (e.g., its height and width are large as compared to its thickness). In another embodiment, the wall interface at the front peripheral edge of the housing may include sharp corners. For example, the front peripheral edge may not include chamfers or corners with a radius but may rather include surfaces that intersect at right angles or at substantially 90 degrees.

As shown in FIG. 1, for example, housing 12 of device 10 can be hexahedral. Although, it should be noted that housing 12 of device 10 is only exemplary and need not be substantially hexahedral, and that, in certain embodiments, the housing of device 10 could generally be formed in any other suitable shape, including, but not limited to, substantially spherical, ellipsoidal, conoidal, octahedral, or a combination thereof, for example.

As shown, housing 12 may include a front wall 14, various side walls, such as top wall 16, bottom wall 18, right wall 20, and left wall 22, and a back wall 24 opposite front wall 14. Housing 12 may be formed from one or more components. The one or more housing components of housing 12 can be formed from a wide variety of materials including, but not limited to, metals, ceramics, plastics, and the like. Various metals may be used including, for example, steel, copper, titanium, aluminum, various metal alloys, and the like.

Housing 12 may be formed from at least two components, such as a front housing component and a back housing component, that are attached together to form the entire housing. For example, housing 12 may include at least one housing component 26 that may include at least front, top, right, left, and bottom walls 14-22. Housing component 26 may include portions configured as a substantially thick band 28 that encircles at least a portion of an I/O region 30 of electronic device 10. For example, in some cases the walls may wrap at least two sides of electronic device 10 (e.g., right and left), while in other cases the walls may completely encircle an I/O region 30 as shown (e.g., top, left, right, and bottom). I/O region 30 represents an area that may include one or more input and/or output components of electronic device 10, such as displays, touch screen displays, buttons, keys, wheels, touch pads, and the like. In one particular implementation, I/O region 30 may be a display region of electronic device 10. The display region may, for example, be a region where text and graphical information is displayed to the user. The thickness of each section of band 28 may be varied. In some cases, the thickness is substantially different, while in other cases the thickness is substantially uniform. This may typically depend on the desired look of the electronic device. The walls that form the band may typically be formed with a substantial thickness, such as greater than 2.0 millimeters and further greater than 3.0 millimeters. In some cases, portions of band 28 may be united by a continuous front wall 14 that covers a greater portion of the front surface than shown in FIG. 1.

Housing component 26 can be formed from a variety of techniques. It may be formed from multiple pieces of material (e.g., metal) that are fused or welded together, thereby forming a single unitary part. Alternatively, the at least one housing component 26 may be an integral metal part formed from a single piece of metal material. The latter can create a seamless appearance (i.e., the walls and interfaces between the walls may be formed from one continuous piece rather than segmented or disconnected portions that are fused or bonded together). In one implementation, a single slab of metal material may be machined out to create a housing component with a cavity for placing the internal components of the electronic device. However, this technique can be quite costly. Therefore, in another implementation, a single sheet of metal may be formed into a housing component with a cavity for holding the internal components of the device.

Various forming techniques can be used to form the sheet metal part. The forming techniques can include, for example, deep drawing, forging, machining, and the like. In one embodiment, the forming techniques may be used to make the housing component look machined from a slab of material. In order to do this, the sheet may have a substantial thickness. For example, the thickness of the sheet may be greater than 2.0 millimeters, further greater than 3.0 millimeters, and in some cases between about 3.0 millimeters and about 4.0 millimeters. In one specific example, the thickness of the metal sheet may be between about 3.0 millimeters and 3.5 millimeters, and more particularly about 3.35 millimeters.

FIGS. 2-9 are various diagrams of an electronic device 50 in accordance with one embodiment of the invention. Like electronic device 10, device 50 may be any electronic device, such as, for example, an all in one computer that integrates a central processing unit ("CPU"), a display, and other components of a computer into a single system (e.g., an iMac™ computer available by Apple Inc. of Cupertino, Calif.).

Computer 50 may include a housing 52 configured to at least partially enclose and support one or more internal components associated with the operation of computer 50. In general, housing 52, which can include several walls, may serve to surround the internal components at a peripheral region thereof so as to cover and protect the internal components from adverse conditions. By way of example, the internal components may include, but are not limited to, a motherboard, processors, circuit boards, controllers, bridges, memory (e.g., RAM, ROM, etc.), expansion slots, and the like. The internal components can also include fans, power supplies, batteries, displays, hard drives, disk drives, modems, antennas, connectors, speakers, microphones, cameras, switches, buttons, and the like.

Housing 52 may also define the shape or form of computer 50 (i.e., the contour of housing 52 can embody the outward physical appearance of computer 50). The contour may be rectilinear, curvilinear, or both. In the illustrated embodiment, housing 52 follows a flat panel form factor with a planar front surface 54, side surfaces 56, and a subtly curved back surface 58. Housing 52 may also provide access to some of the internal components of computer 50, such as, for example, via openings in its walls. By way of example, housing 52 may include one or more perforations or holes 57 along top wall 56A for providing sound passages to a microphone within housing 52, a slot 59 along right side wall 56C for an optical drive (e.g., a DVD drive), connector openings 61 along back wall 58, vent openings 63 along bottom wall 56B, a memory access door 65 along bottom wall 56B, and a display opening 67 at front wall 54.

Although, housing 52 may be formed from a single component, in the illustrated embodiment, the housing may include a front housing component 60 and a rear housing component 62 that are assembled together to form housing 52. Front housing component 60 may form front wall 54, top wall 56A, bottom wall 56B, right side wall 56C, left side wall 56D, and portions of rear wall 58, while rear housing component 62 may form the remaining portions of rear wall 58 of housing 52. In one embodiment, front housing component 60 may be configured with seamless continuous surfaces. Furthermore, the side walls of front housing component 60 may be configured as a band 70 that may wrap around the sides of rear housing component 62. Front wall 54 may include a chin 72 that may extend from band 70. Chin 72 may represent a portion of the housing that covers the CPU portion of the computer.

Although FIGS. 2-9 are directed at a computer, it should be noted that this is not a limitation and that the various embodiments described herein may also be applied to similar form factor devices, such as monitors and televisions, for example. The embodiments may also be applied to other form factor devices, such as handheld electronic devices, including media players, cellular telephones, smart telephones, personal digital assistants, remote controls, storage devices, and the like, as well as other computer systems, such as laptops, tablet computers, and the like. In essence, the embodiments can be applied to most consumer electronic devices.

Although FIGS. 2-9 include a chin portion 72, it should be noted that in some alternative embodiments, the chin portion may be removed such that the band completely encircles the display region (e.g., the top, bottom, left, and right sides of display opening 67). This type of arrangement may be well suited for monitors and televisions that do not include as an extensive electronic sub-system as a computer. This type of arrangement may also be well suited for full screen handheld devices or portions of laptops.

Figure 10:
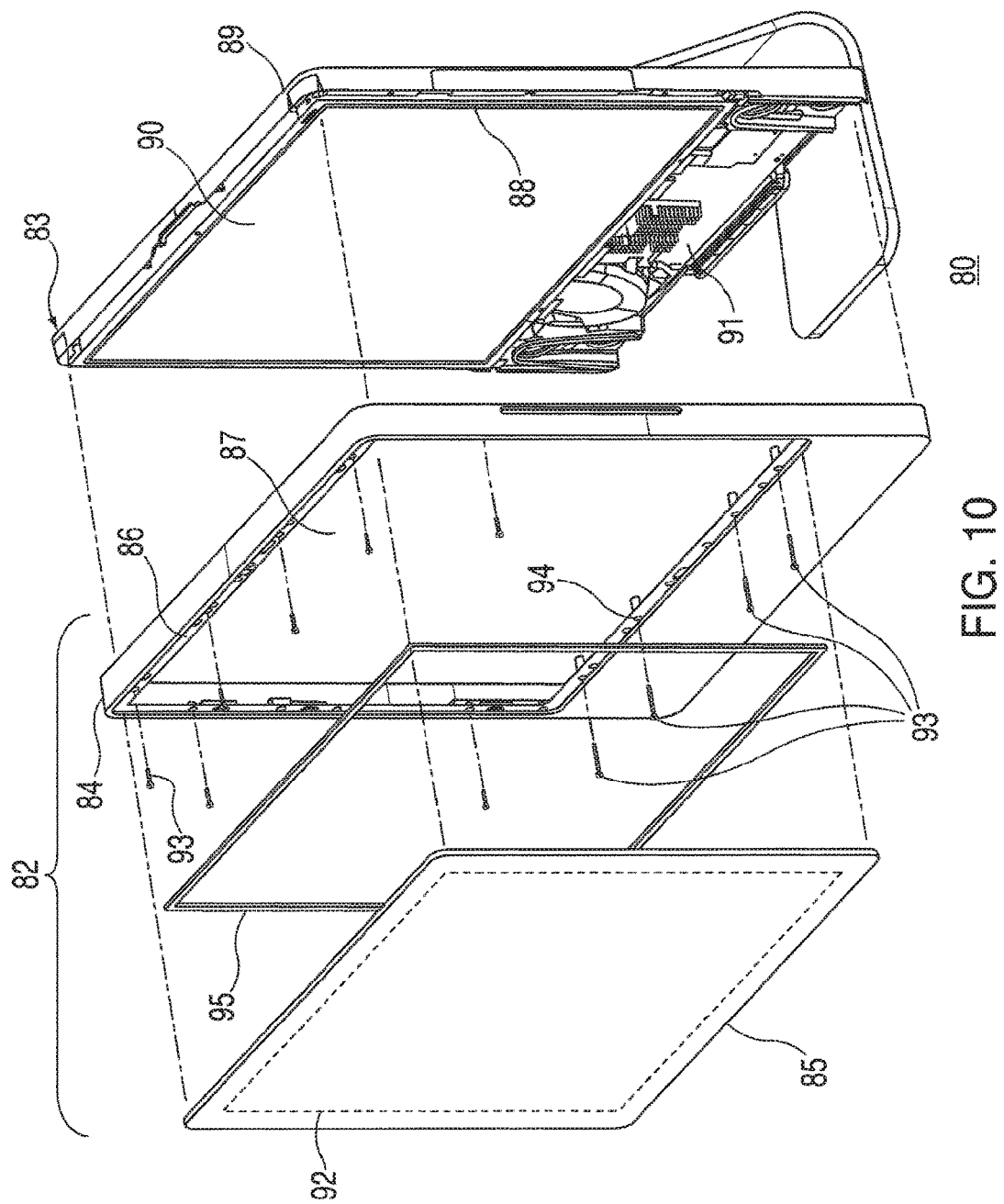
FIG. 10 is an exploded top, front, right perspective view of an electronic device, in accordance with some embodiments of the invention.

FIG. 10 is an exploded perspective diagram of a flat panel computing device 80 in accordance with one embodiment of the invention. Flat panel computing device 80 may generally correspond to computer 50 shown and described in FIGS. 2-9. Device 80 may include a front subassembly 82 and a rear subassembly 83. Front subassembly 82 may be attached to rear subassembly 83 to form device 80.

Front subassembly 82 may include a bezel 84 and a front cover window 85, which may be disposed within bezel 84. Bezel 84 may include a recessed portion 86 that may surround an opening 87 at its front surface for supporting front cover window 85. That is, front cover window 85 may fit within recessed portion 86 and may be disposed in front of opening 87. Front cover window 85 can help define a display region of device 80. Front cover window 85 may be configured to protect a display component disposed behind it.

Rear subassembly 83 may include at least an electronic system 88 that may be contained and supported within a rear cover 89. Electronic system 88 may generally include a display component 90 and one or more computer components 91, such as processors, memory, drives, power supplies, and the like. Rear cover 89 may include a back wall and side walls. The side walls of rear cover 89 may be configured for insertion within the side walls of bezel 84. For example, the outer periphery of rear cover 89 may fit within the inner periphery of bezel 84. Recessed portion 86 around opening 87 in bezel 84 may include various stand offs, bosses, and/or through holes for attaching bezel 84 to rear cover 89. In one embodiment, screws 93 may be used to secure bezel 84 to rear case 89 via holes 94 in the flanged portion of recess 86.

Cover window 85 may include an opaque layer of material or a coating 92 (e.g., a coating of black ink) around or along its rear periphery in order to hide the flange portions disposed behind it. Cover window 85 can be attached to bezel 84 using a variety of techniques. In one embodiment, cover window 85 may be secured to bezel 84 using magnets that may be embedded within the flange portion of recess 86 to attract metallic sections that may be coupled to or located on the inner surface of cover window 85 (e.g., metallic section 95). This may allow for cover window 85 to be removed. It should be appreciated, however, that other conventional techniques can be used.

Figure 11:
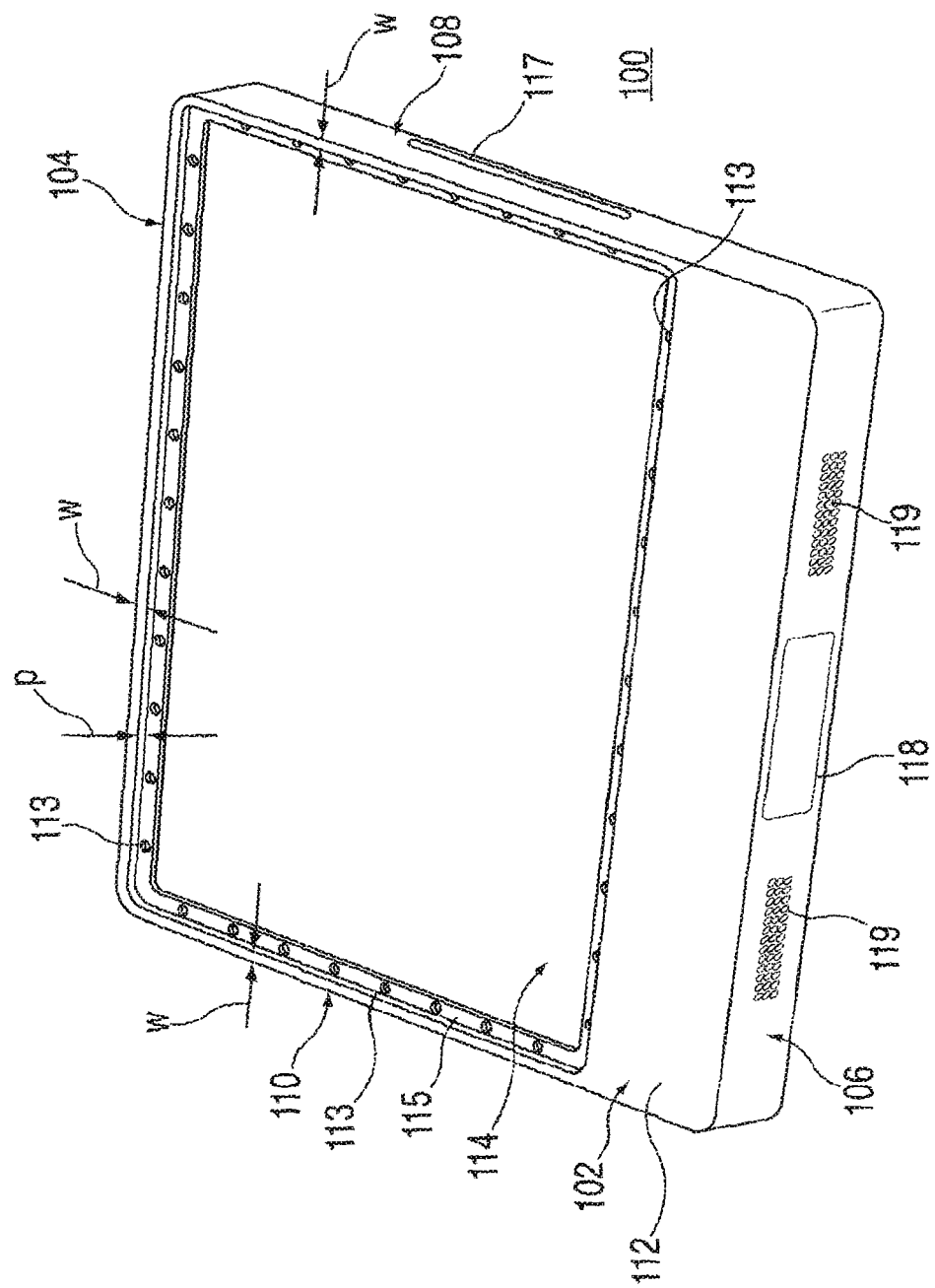
FIG. 11 is bottom, front, right perspective view of a housing component of an electronic device, in accordance with some embodiments of the invention.

FIG. 11 is a diagram of a bezel 100 in accordance with one embodiment of the invention. Bezel 100 may, for example, generally correspond to the bezel shown in FIGS. 2-9 and/or FIG. 10. Bezel 100 may include a front wall 102, a top wall 104, a bottom wall 106, a right side wall 108, and a left side wall 110. The top, bottom, right side, and left side walls may protrude perpendicularly back from the outer peripheral edge of front wall 102. The top, bottom, right side, and left side walls 104-110 may, for example, be positioned at substantially right angles to front wall 102. The interface of two walls may be configured to produce a sharp corner (e.g., a substantially 90 degree angle between two wall surfaces), such that it does not create a corner radius or a chamfer, for example.

Furthermore, the various walls may be integral and continuous pieces formed from the same material part. As shown, for example, front wall 102 may include a flat solid chin section 112 and an opening 114 that forms a display or other I/O region. Front wall 102 may include a recessed portion 115 around opening 114. Recessed portion 115 may form a flange about opening 114 that can be used to mount a cover window (e.g., cover window 85 of FIG. 10). Recess 115 may typically have a depth p that may be about the same size as the thickness of the cover window (e.g., the thickness of the glass or other suitable material used to form the cover window).

The area of front wall 102 around recessed portion 115 at the location of the side walls (e.g., the width w of front wall 102 about recessed portion 115) may be about the same width about some portions or all of opening 114 (e.g., at least about the portions of opening 114 that are not adjacent chin 112, as shown in FIG. 11). Width w about portions of opening 114/recessed portion 115 may also be substantially equal to the thickness of one or more of top, bottom, right side, and left side walls 104-110 that may protrude perpendicularly back from the outer peripheral edge of front wall 102. Width w of front wall 102 about opening 114 may be substantially equal to the thickness of at least one of the side walls (e.g., the thickness of a sheet of material that may be used to form bezel 100) such that at least one of the top, bottom, right side, and/or left side walls 104-110 may appear to form a band about at least a portion of opening 114.

When a cover window is disposed within recessed portion 115, it may appear as though top, bottom, right side, and left side walls 104-110 are in the form of a band that wraps around a display (e.g., the cover window). As shown, the flange portion formed by recessed portion 115 about opening 114 may include various through holes 113 for accepting screws, for example. Top wall 104 may include I/O component holes therethrough (not shown). Right side wall 108 may include an I/O component slot 117. Bottom wall 106 may include an I/O component access opening 118, such as, for example, a memory access opening in addition to one or more vent holes 119 for cooling the electronic device, for example. Bezel 100 may be formed using any of the methods described herein.

Figure 12:
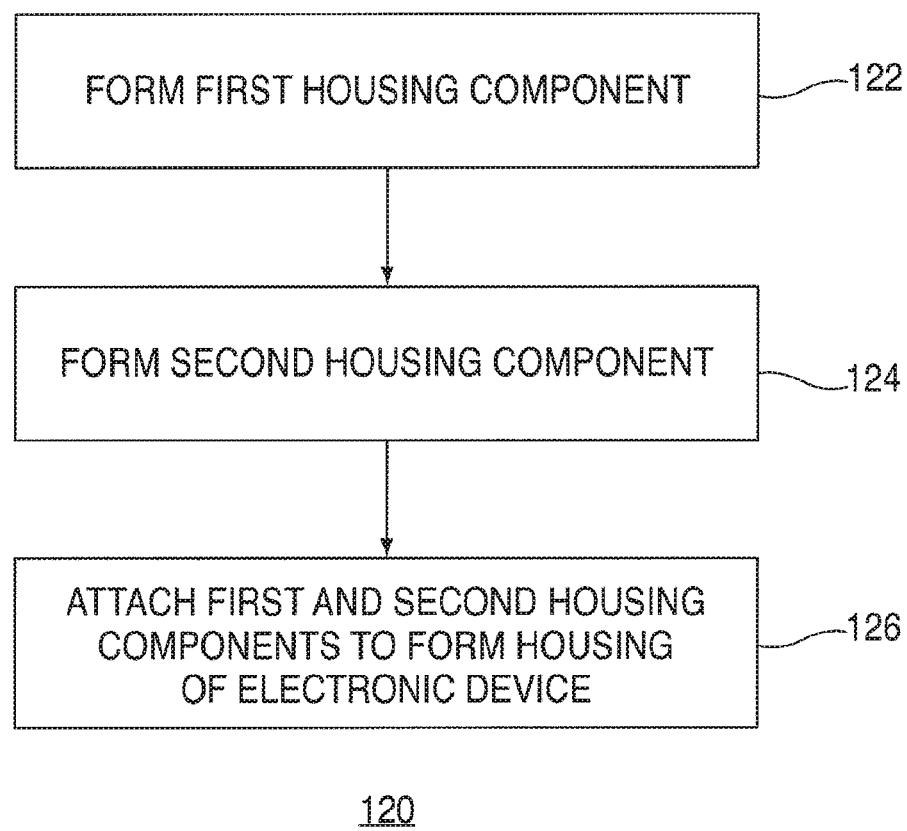
FIG. 12 is a flowchart of an illustrative process for assembling an electronic device, in accordance with some embodiments of the invention.

FIG. 12 is a flowchart of an illustrative process 120 for assembling an electronic device in accordance with one embodiment of the invention. This may include block 122 where a first housing component is formed. For example, the first housing component may be configured to define the entire front and side surfaces, as well as portions of the back surface, of the housing of the electronic device.

In one embodiment, the first housing component may be a substantially uniformly thick band of side walls that may form a continuous seamless perimeter around the outer periphery of the electronic device. The first housing component may further include a front wall that is continuous and seamless with one or more of the side walls.

In one embodiment, the first housing component may be made to appear as if it was cut from a slab of material. In one embodiment, the first housing component may be formed from metal. The metal may, for example, be aluminum. In one embodiment, the first housing component may be formed from a single piece of solid material. The single piece of material may, for example, be a piece of flat stock (e.g., sheet metal). In one implementation, the flat stock may be configured with a substantial thickness. For example, it may have a thickness greater than 2 millimeters, more particularly greater than 3 millimeters, and further between about 3 millimeters and about 4 millimeters, and more particularly between about 3 millimeters and about 3.5 millimeters. In one specific example, the thickness of the metal flat stock may be about 3.35 millimeters. Of course, the thickness can be widely varied and is not limited to these examples. For example, the thickness can be greater than 4 millimeters.

In one embodiment, the first housing component may not be formed only with a machining processes. In another embodiment, the first housing component may not be formed only with an extrusion process. Rather, in accordance with one embodiment, the first housing component may be formed via a combination of processes. In one implementation, at least one of the processes may include forging. Forging can be a process of working a hot or cold material, such as metal, to a desired shape by impact or pressure from hammers, presses, or forging machines. In one example, forging may be used to help form sharp edges at the interface between the front surface and the side surfaces. Sharp corners may refer to corners where interfacing surfaces are at substantially right angles or 90 degrees. Sharp corners may also refer to corners that do not include chamfers or a large radius.

Additionally or alternatively, the process may include drawing, and further deep drawing. Drawing may refer to forming sheet metal into shapes, such as cylindrical or box shaped parts, by using a punch that may press the sheet metal into a die cavity. Drawing may also refer to placing a flat blank over a shaped punch to draw the flat material over a die, thereby creating a formed shape. In one example, drawing techniques may be used to form the general shape of a first housing component, and thereafter forging may be used to adjust the thickness of the material at specific locations around the shaped part (e.g., forging can be used to create sharp edges at locations where drawing may have created edges with a radius). As should be appreciated, drawing processes may typically create corners with a radius.

Machining processes may further be applied to clean up the surfaces of the first housing component after other processes have been implemented. For example, machining may be used to clean up forged surfaces. In one example, forging may be used to create coarse sharp corners and machining may be used to create fine sharp corners. In another example, forging may be used to over mold the corners so that there is enough material to machine. Machining may also be used to add features on the first housing component. For example, openings may be machined into or through the walls of the first housing component, or attachment features, such as screw holes, posts, standoffs, bosses, and the like, may be created on or through surfaces of the first housing component. In addition, machining may be used to create recesses on both inner and outer surfaces of the housing component. Additional processes may also be utilized, including, for example, punching, stamping, polishing, applying surface finishes (e.g., sand blasting, anodizing, etc.), ironing, an extrusion process, cutting, molding, and the like.

Process 120 may also include block 124 where a second housing component may be formed. In one embodiment, the second housing component may be configured to define the remaining portions of the back surface of the housing of the electronic device. For example, the remaining portions may be portions retained within the band section of the first housing component.

In one embodiment, the first housing component may be formed via a first process and the second housing component may be formed via a second process. The processes may be similar or they may be different. For example, the first housing component may be formed via various forming techniques, such as drawing, an extrusion process, machining, forging, and bending, while the second housing component may be formed via different processes, such as injection molding, punching, and the like. It should be appreciated that injection molding is not limited to only plastic material and may be applied to other materials, such as metals. Liquid Metal is one example of a metal material that can be injected molded.

In one embodiment, the first and second housing components may be formed with the same materials. For example, they may both be formed with metals, and further the same metals. In another embodiment, the first and second housing components may be formed with different materials. For example, one may be formed from plastic (e.g., polycarbonate, ABS, PC, etc.) while the other may be formed from metal (e.g., aluminum, steel, titanium, etc.). Ceramics may also be used. In one particular embodiment, the first housing component may be formed from metal and the second housing component may be formed from plastic.

Process 120 may also include block 126 where the first and second housing components may be attached to form the housing of the electronic device. The housing may typically be configured to at least partially enclose one or more internal components of the electronic device. The internal components may be widely varied and may depend on the type of electronic device. The internal components may include a display and, in such cases, the first housing component may include an opening for allowing a user to view the display through the opening. The opening may, for example, be partially or entirely defined by a continuous band that can form the side surfaces as well as portions of the front surface of the housing component. The internal components may include other components as well. For example, they may include computer components that can be covered by the front wall of the first housing component. In one embodiment, the internal components may be disposed between the first and second housing components. In one implementation, the internal components may be installed into the second housing component and, thereafter, the first housing component may be attached to the second housing component, thereby enclosing the internal components between the housing components.

Figure 13:
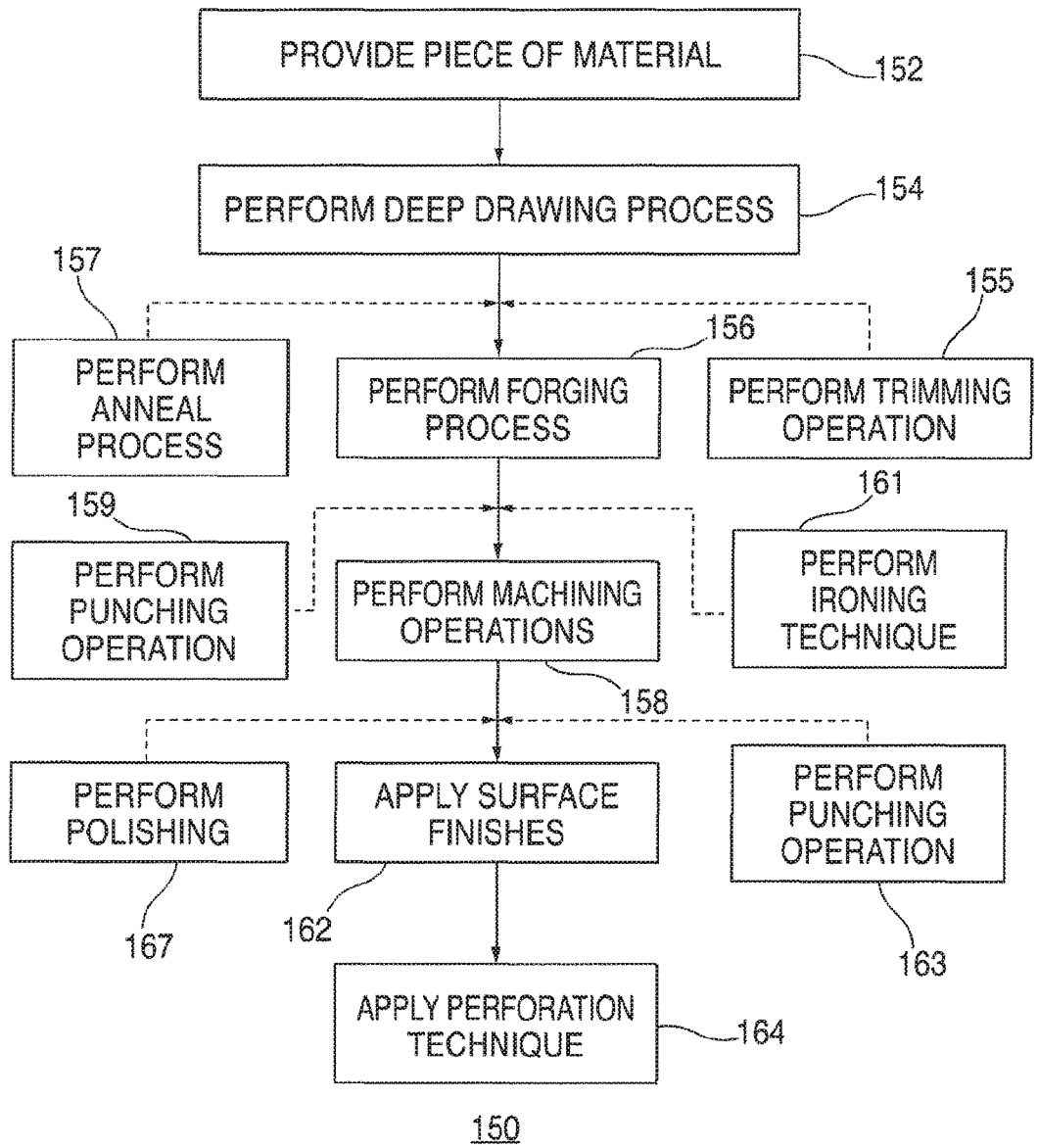
FIG. 13 is a flowchart of an illustrative process for manufacturing a housing component of an electronic device, in accordance with some embodiments of the invention.

FIG. 13 is a flowchart of an illustrative process 150 for manufacturing a housing component of an electronic device, in accordance with one embodiment of the invention. The method may be used to make a housing component look as if it was hollowed out from a solid slab of material, while being producible at a reasonable cost. The method may also be used to create a housing component, such as a bezel, that looks like a sheet metal hoop, for example.

Process 150 may include block 152 where a piece of material (e.g., metal flat stock) is provided. The material properties and thickness may typically be selected based on the processing steps to be applied. The material may have a substantial thickness. For example, it may have a thickness greater than 2 millimeters, more particularly greater than 3 millimeters, and further between about 3 millimeters and about 4 millimeters, and more particularly between about 3 millimeters and about 3.5 millimeters. In one specific example, the thickness of the material may be about 3.35 millimeters. The material, such as metal flat stock, may additionally be formed from aluminum. The type of aluminum may typically be balanced with future processing steps so as to allow proper metal forming without ripping and tearing, and without creating flow marks, as well as to provide needed rigidity and strength for a housing component. In essence, the material may be soft enough to forge, but strong enough to be an enclosure. In one example, 5350 aluminum may be used.

Process 150 may also include block 154 where a deep drawing process may be performed on the material to create a housing component. The housing component may be created to include a continuous and seamless front wall and sidewalls. Various shapes may be formed. In one embodiment, the front wall may have a substantially rectangular shape with rounded corners at the interface between at least one of the side walls and the front wall. The material properties may be selected in such a way that the deep draw process does not rip the material as it is drawn. It also may be of a substantial thickness.

Process 150 may also include block 156 where a forging process may be performed on the housing component. This forging process may help increase the thickness of one or more corners and/or may help to form sharp corners at the interface between the front wall and at least one of the side walls (i.e., to produce a sharp edge instead of a rounded edge). Generally, the forging technique may include applying a force on the back surface of the housing component in order to push material to the front edge, which may have been rounded during the deep drawing process (i.e., push on the material to increase the thickness and fill the rounded edge at the front corner). This may be referred to as forging forward. The force may be a continuous force or it may be an intermittent hammering force. The number of operations as well as the parameters associated with the forging process may typically be selected to prevent flow marks and tearing, which can occur during a forging process.

A trimming operation 155 may be performed after the deep draw process and before the forging process. Alternatively or additionally, trimming operation 155 may be performed before the deep draw process and/or after the forging process. The trimming operation may be configured to clean up the back surface so that the forging process can push on a uniformly flat surface. If the back surface is not trimmed, the thickness of the part may be adversely affected.

An annealing process 157 may be performed before the forging process to help soften the material, thereby helping to prevent ripping and tearing that might occur during the forging process. In essence, annealing may include baking the housing component in order to help remove some of the internal stress, which may lead to tears, rips, or surface imperfections. Alternatively or additionally, annealing process 157 may be performed before or after the trimming process and/or after the forging process.

Process 150 may also include block 158 where at least one machining operation may be performed on the forged housing component. The at least one machining process may be configured to further sharpen one or more corners at the interface between the front wall and at least one of the side walls. In one embodiment, the forging process may be configured to over mold the front edge of the front wall so as to provide enough material to machine off the front edge of the front wall to a flat surface relative to the surface of the side wall (i.e., near 90 degrees).

Additional machining operations may be performed to clean up the outer surfaces of the housing components (e.g., to make the outer surfaces flat). Machining typically does not have to occur on the inner surfaces since these are usually hidden from view when the part is assembled into an electronic device. By way of example, the side surfaces may be machined flat. The front surfaces may also be machined flat.

Additional machining operations may be performed to thin out one or more of the walls for subsequent processes. For example, a portion of the inner surface of a wall may be reduced to between about 0.5 millimeters and about 1 millimeter.

Additional machining operations may be performed to create one or more openings in the walls. For example, openings for providing access to internal components, such as memory, may be created in the walls. In one embodiment, this may be performed on the bottom wall.

A stamping or punching operation 159 may be performed after forging and before machining in order to create one or more openings in the housing component. By way of example, a display window opening may be created using stamping or punching. Thereafter, machining operations can be used to clean up the stamped edges of the opening. Furthermore, the machining operation can be used to create a recess in the front wall around the opening. The recess may be configured to receive a cover window therein so that it may be substantially flush with the surface of the front wall. Additional machining operations can be performed to create stand offs, bosses, screw openings, and/or recesses at the recess flange portion for helping attach the housing component to another housing component. In one embodiment, recesses for retaining magnets may be created in the flange portion. The magnets may be configured to help retain the cover window in the recess in front of the opening. The cover window may include a coating around its peripheral edge to cover and hide the flange portion from view. By way of example, a black coating may be applied to the inside surface at the perimeter of the cover window. Additionally or alternatively, stamping or punching operation 159 may be performed before forging and/or after machining.

An ironing technique 161 may also be performed after forging and before machining in order to help straighten the walls. Straighter walls are easier to machine. Also, less material may need to be removed in order to make a flat surface. As should be appreciated, forging may create wavy walls due to forces being applied through the walls. Ironing techniques may help reduce the waviness. In essence, ironing provides a portion that can be better machined. Alternatively or additionally, ironing technique 161 may be performed before forging and/or after machining.

The machining operations can be performed in separate process steps, such as, for example, in different machining units, or they may be performed in a single machining unit. A machining unit may, for example, be a computer numerical controlled ("CNC") unit.

Once the housing component is machined, additional operations may be performed to further enhance the housing component. In one embodiment, as shown in block 162, surface finishes may be applied to the outer surfaces of the housing component. By way of example, the outer surfaces may be sandblasted to create a desired surface texture.

Furthermore, the housing component may be anodized. Alternatively or additionally, surface finishes may be performed before forging and/or after machining.

A polishing operation may be performed before applying the surface finishes, as shown in block 167. Polishing operations may be used to reduce and/or eliminate chatter marks as well as to provide a smooth surface. The polishing operation may need to be careful of rounding corners. Alternatively or additionally, polishing operation 167 may be performed after applying the surface finishes.

In addition, other punching operations may be performed as shown in block 163. For example, vent holes may be punched into one of the side walls, such as, for example, the bottom wall. In one implementation, the vent holes may be placed in inner recessed sections of the housing component (e.g., thinned out sections of the housing). This may make the punching operation easier and cleaner.

In one embodiment, as shown in block 164, a hole formation technique may be applied to one or more of the walls of the housing component. These techniques may be used to create hidden indicators (e.g., LEDs) as well as provide one or more openings through which microphones, speakers, and other I/O components may function. In one implementation, the holes may be placed in inner recessed sections of the housing component. This may make the hole formation operation easier and cleaner. It also may allow for a better interface between the inside and outside of the device (e.g., sound and light may pass more freely through shallower holes). Hole formation technique 164 and/or punching operation 163 may be performed at any time during process 150.

Figure 14:
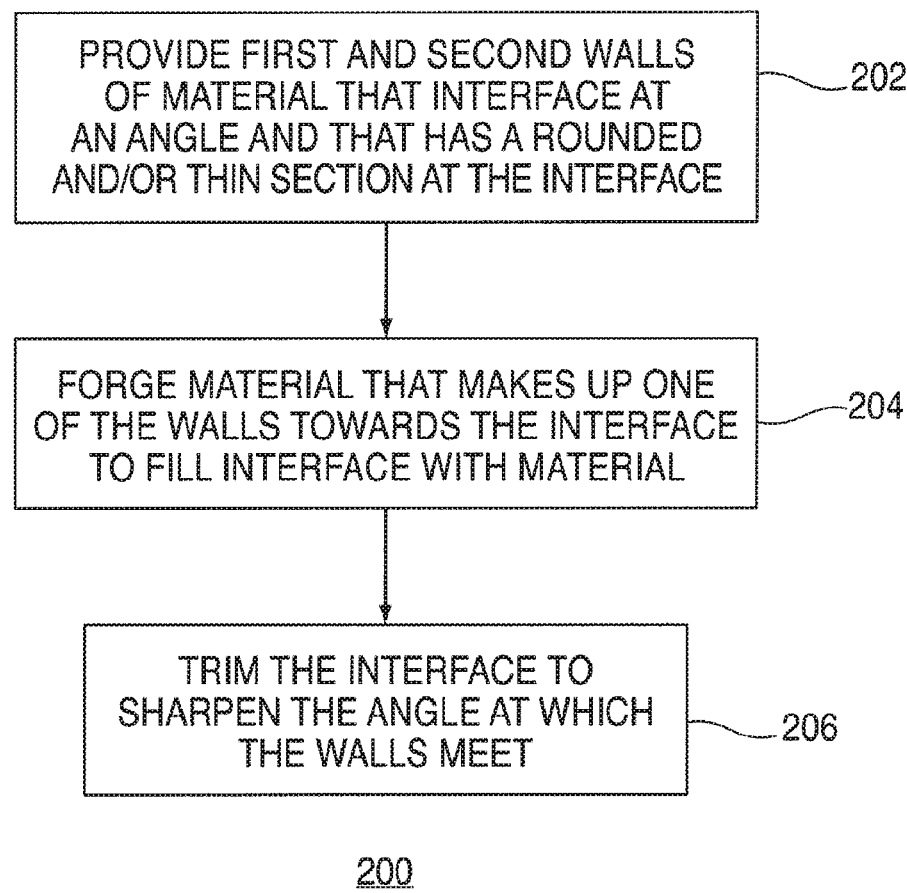
FIG. 14 is a flowchart of an illustrative process for manufacturing a housing component of an electronic device, in accordance with some embodiments of the invention.

FIG. 14 is a flowchart of an illustrative process 200 for manufacturing a housing component of an electronic device in accordance with one embodiment of the invention. Process 200 may include block 202 where first and second walls of material may be provided at an angle relative to each other and that have a rounded corner and/or a thin section at their interface with each other. This arrangement may be found after a deep draw process performed on a piece of sheet metal. For example, a flat piece of material (e.g., metal) may be drawn to form a box like structure having a main wall and one or more side wall(s) extending outwardly from the main wall. The main wall may, for example, be substantially rectangular with one or more of its side edges having a side wall placed substantially perpendicular to the main wall. The surface of the main wall and the surface of the side wall(s) may, for example, be at substantially 90 degrees with respect to each other. However, in other embodiments, the walls may interface at any suitable angle, such as in a range of between a 10° angle and a 1700° angle, and not necessarily a 900° angle. Although the walls may interface with each other at a particular angle, the interface itself may be somewhat rounded or otherwise not sharp.

Process 200 may also include block 204 where material that makes up one of the walls may be forged forward towards the interface of that wall with at least one other wall in order to push the material towards the interface, thereby filling the interface (e.g., rounded edge or corner) with material. In one example, a pressure may be applied to a side of a wall opposite the interface. In this example, pressure may be applied away from where the forging is desired. In one embodiment, the interface may be over forged so that the interface may have excess material. The material may be pushed through one of the walls from a force being exerted on an opposite side of the wall. The material may be forced against a reference surface such that the interface may be somewhat molded to a desired shape and thickness.

Process 200 may also include block 206 where the interface may be trimmed so that the surfaces of the walls meet at a sharp angle, such as a substantially 90 degree angle. With regards to over forming, trimming may be easier to do with extra material at the interface. The edge or corner at the interface may be trimmed, such as, for example, by machining the surfaces of the two walls to a sharp edge or corner with substantially no rounding or chamfering. The trimming may sharpen the interface so that the surfaces of the walls are at any suitable angle with respect to each other, and not necessarily at a 90 degree angle.

Figure 15A:
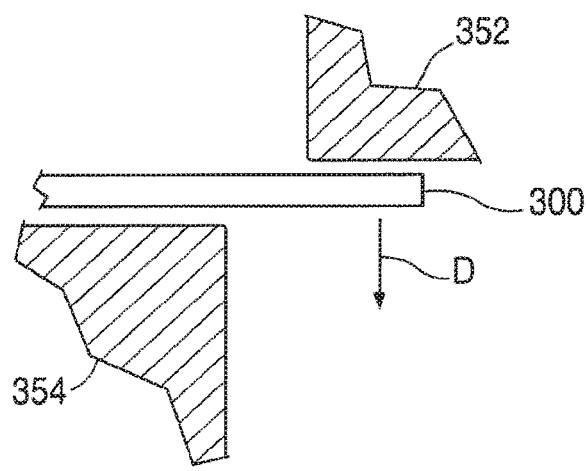
FIGS. 15A-15E are cross-sectional views of a portion of a housing component of an electronic device in various stages of manufacture, in accordance with some embodiments of the invention.

FIGS. 15A-15E illustrate a portion of a housing component of an electronic device in various stages of manufacture in accordance with one embodiment of the invention. FIG. 15A is a cross-sectional view showing a portion of material 300 (e.g., flat stock metal) being put through a deep draw. Draw portion 352 may be drawn in the direction of arrow D toward draw portion 354, thereby shaping material 300 into the curved shape of FIG. 15B.

Figure 15B:
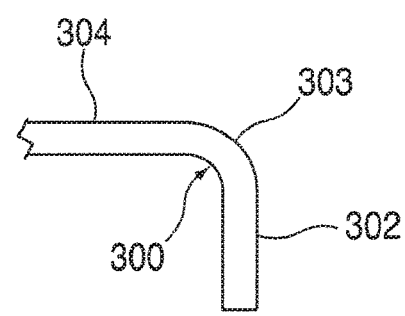

FIG. 15B is a cross-sectional view showing portion 300 as a housing component, particularly a front wall 302 and a side wall 304 after the deep draw. As shown, intersection or edge or corner 303 where front wall 302 and side wall 304 meet may be somewhat rounded.

Figure 15C:
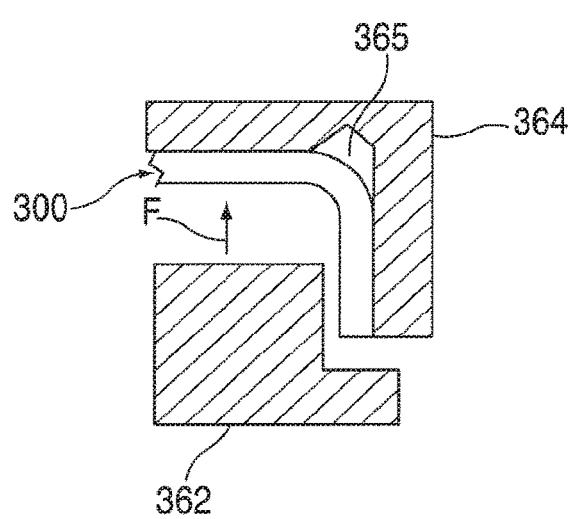

FIG. 15C is a cross-sectional view showing housing component 300 being put through a forging press. The forging press may include a first forge portion 362 and a die 364. First forge portion 362 may be forged in the direction of arrow F toward die 364 for helping form a sharp corner at intersection 303 of walls 302 and 304. Die 364 can include a sharp corner as desired or it may include an overflow region (e.g., overflow region 365) for over forming the corner at intersection 303. During forging, pressure may be applied to the back of a wall to slowly push material of the wall forward towards the corner. As it is pressed, the material may deform to fit the shape of the die, thereby forging material 300 into the shape of FIG. 15D.

Figure 15D:
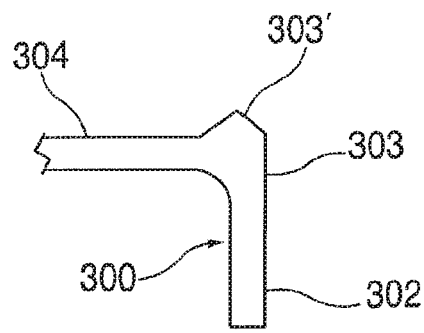

FIG. 15D shows housing component 300 after the forging process. As shown, corner 303 may include a protrusion 303' created by forging material into over flow region 365 of die 364.

Figure 15E:
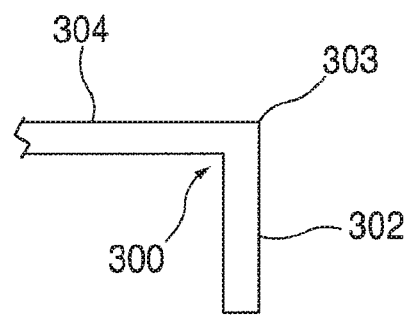

FIG. 15E shows housing component 300 after machining corner 303 to a right angle (e.g., by removing at least a portion of protrusion 303').

Figure 16:
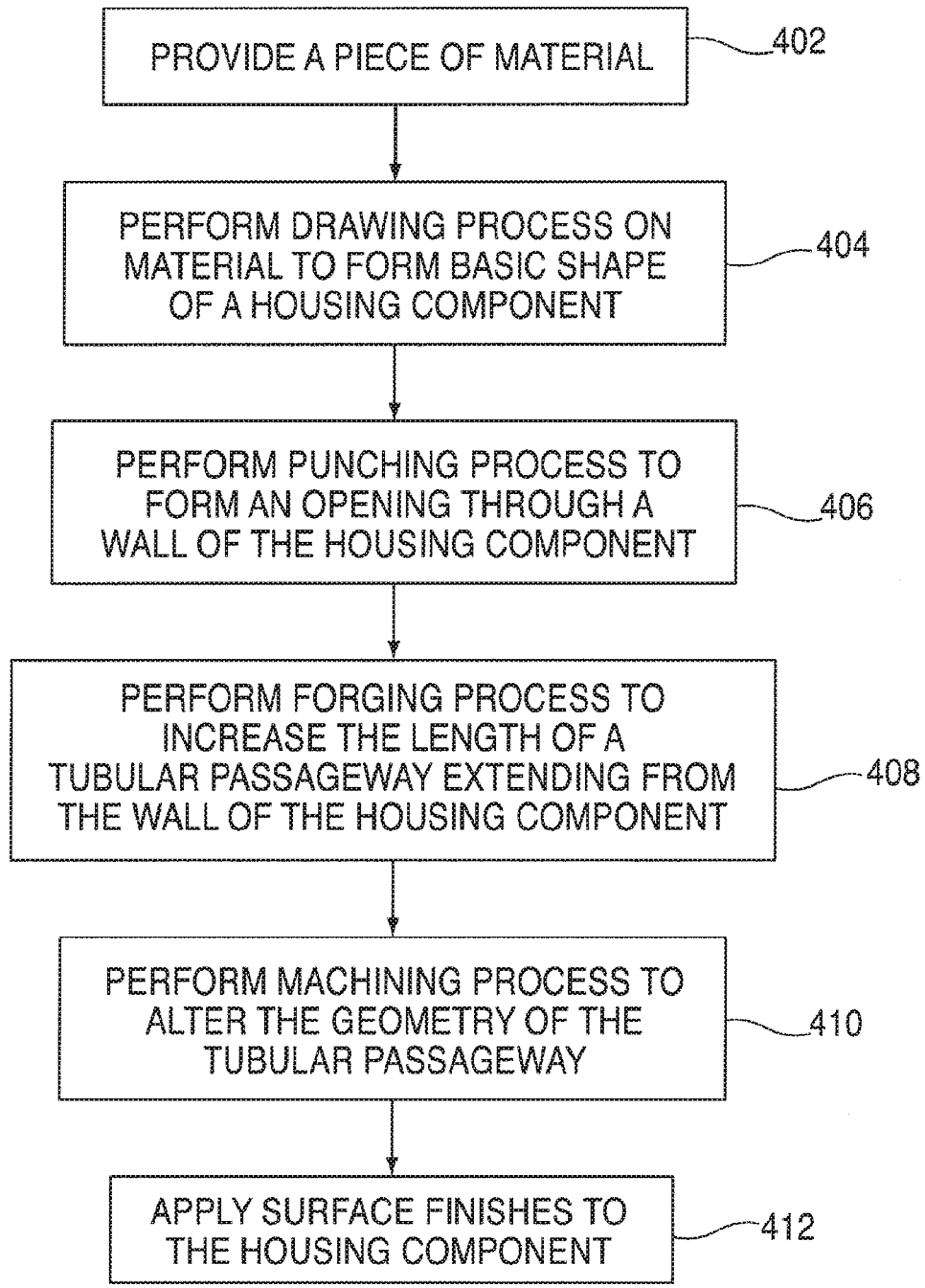
FIG. 16 is a flowchart of an illustrative process for manufacturing a housing component of an electronic device, in accordance with some embodiments of the invention.

FIG. 16 is a flowchart of an illustrative process 400 for manufacturing an internal elongated tube through and integral with a housing component of an electronic device, in accordance with one embodiment of the invention. The tube can be used to provide access to one or more components of the electronic device internal to the housing component, such as an audio jack tube for allowing a user the ability to access an audio jack component of the electronic device. The method may be used to create a housing component having a hollow tube extending therefrom without requiring any additional material than would be needed to create the housing component without the tube. The method may also be used to make a housing component look as if it was made from a material sheet with a thickness greater than that of the material actually forming the housing component.

Process 400 may include block 402 where a piece of material (e.g., metal flat stock) is provided. The material properties and thickness may typically be selected based on the processing steps to be applied. The material may have a relatively substantial thickness. For example, the thickness may be in the range of 0.5 millimeters to 1.1 millimeters. In some embodiments, the thickness may be in the range of 0.6 millimeters to 1.0 millimeter. In some embodiments, the thickness may be in the range of 0.7 millimeters to 0.9 millimeters. In some embodiments, the thickness may be about 0.8 millimeters or any other suitable thickness. The material, such as metal flat stock, may additionally be formed from stainless steel or aluminum. The type of aluminum may typically be balanced with future processing steps so as to allow proper metal forming without ripping and tearing, and without creating flow marks, as well as to provide needed rigidity and strength for a housing component. In essence, the material may be soft enough to forge, but strong enough to be an enclosure. In one example, 5350 aluminum may be used.

Process 400 may also include block 404 where a drawing process, such as a deep drawing process, may be performed on the material to create the basic shape of the housing component. The housing component may be created to include a continuous and seamless front wall and one or more sidewalls. Various shapes may be formed. In one embodiment, the front wall may have a substantially rectangular shape with rounded corners at the interface between at least one of the side walls and the front wall. The material properties may be selected in such a way that the drawing process does not rip the material as it is drawn. In other embodiments, the housing component may only include a single wall such that block 404 of process 400 may be skipped.

Process 400 may also include block 406 where a stamping or punching operation may be performed to form an opening through a wall of the housing component between an external surface and an internal surface of the housing component wall. The punching operation may be repeated multiple times, for example, wherein each punching operation utilizes a larger punching size, such that the size of the opening is enlarged further with each punching operation. Each of the one or more punching operations may stretch portions of the material of the housing component, thereby thinning the material about the opening being formed. In some embodiments, the punching may be done through the housing component from an external surface of the housing component, through the housing component, and towards and ultimately through an internal surface of the housing component. Material from the external surface, about the opening punched through the external surface, may be forced downwardly during the punching operation to form the surfaces defining a tubular passageway through the housing component.

Process 400 may also include block 408 where a forging process may be performed on the housing component. This forging process may form or help increase the length of the tubular passageway formed through the housing component and extending from the internal and external surfaces of the housing component wall. Generally, the forging process may include forging a first portion of the material about the external opening in the external surface to extend the length of the passageway away from the external surface. The forging technique may include applying a force on the material of the housing component about the opening of the passageway at the external surface of the housing. Material from the external surface, about the opening punched through the external surface, may be forced downwardly during the forging operation, internal to the housing component, such that the material is stretched to form the internal surfaces defining the passageway through the housing component. This may be referred to as forging forward. The force may be a continuous force or it may be an intermittent hammering force. The number of operations as well as the parameters associated with the forging process may typically be selected to prevent flow marks and tearing, which can occur during a forging process.

Process 400 may also include block 410 where at least one machining operation may be performed on the forged housing component to alter the geometry of the tubular passageway. The at least one machining process may be configured to further sharpen one or more edges at the openings or ends of the tube (e.g., at the external surface of the housing component wall about the opening to the passageway formed therethrough). In one embodiment, the forging process may be configured to create rounded edges about the opening of the tube at the external surface of the housing component wall, such that the machining process may remove some material at the external opening of the tube and along at least portions of the length of the tube as it extends away from the external surface of the housing component. The machining process may, therefore, create a sharp edge on the external surface of the housing component wall at the interface between the external wall surface and the material now defining the internal surfaces of the tube.

The at least one machining process may additionally or alternatively be configured to machine along the length of the tube to create the final cross-sectional area or diameter of the tube as it extends inwardly from the external surface of the housing component wall. The final cross-sectional size or diameter of the tube may be relatively large. For example, the cross-section may be in the range of 5.0 millimeters to 15.0 millimeters. In some embodiments, the cross-section may be in the range of 7.0 millimeters to 13.0 millimeters. In some embodiments, the cross-section may be about 10.0 millimeters, or any other suitable size.

Moreover, additionally or alternatively, the at least one machining process may be configured to machine across the tube at its end opposite to the external opening in the external surface of the housing component wall, so as to define the final length of the tube. The final length of the tube may be relatively large as compared to the thickness of the material sheet forming the housing component wall. For example, the length of the tube may be in the range of 2.0 millimeters to 4.0 millimeters. In some embodiments, the length may be in the range of 2.5 millimeters to 3.5 millimeters. In some embodiments, the length may be about 3.0 millimeters or any other suitable length. In some embodiments, when viewed by a user external to the device, the thickness of the material forming the housing component may appear to be equal to the length of the tube, as that may be the only portion of the housing component visible to the user that is not along the external surface of the housing. This may provide the user with the sense that the housing component is more rigid than the user might otherwise believe if able to see the true material thickness of the housing component.

Once the housing component and its tube are machined, additional operations may be performed to further enhance the housing component. In one embodiment, as shown in block 412, surface finishes may be applied to the outer surfaces of the housing component and the internal surfaces of the tube. By way of example, the surfaces may be sandblasted to create a desired surface texture. Furthermore, the housing component may be anodized. Alternatively or additionally, surface finishes (e.g., sandblasting, polishing, and/or annealing) may be performed before and/or after any of the drawing, forging, and machining operations.

Figure 16A:
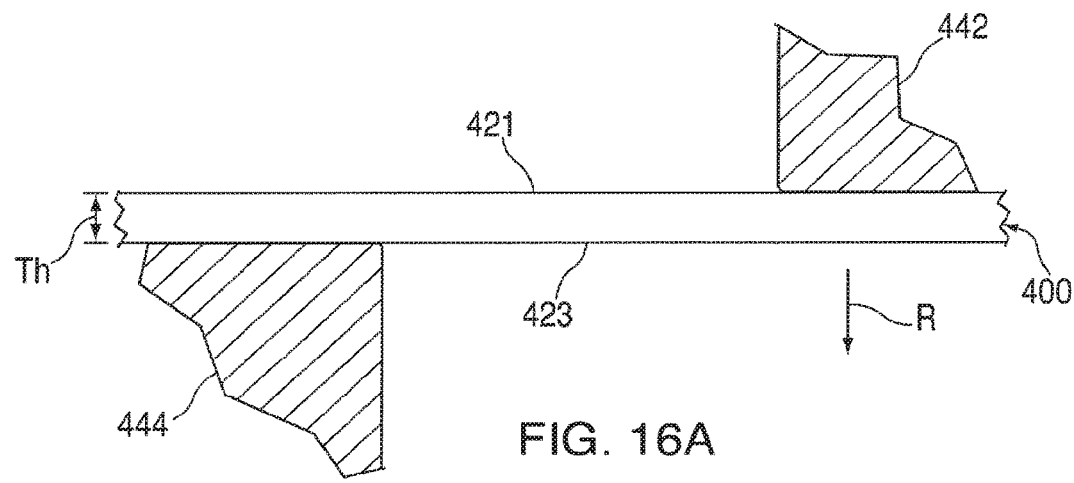
FIGS. 16A-16G are cross-sectional views of a portion of a housing component of an electronic device in various stages of manufacture, in accordance with some embodiments of the invention.

FIGS. 16A-16G illustrate a portion of a housing component of an electronic device in various stages of manufacture in accordance with one embodiment of the invention. FIG. 16A is a cross-sectional view showing a portion of material 420 that may be provided for forming a housing component according to some embodiments of the invention. The material properties and thickness of material portion 420 may typically be selected based on the processing steps to be applied. The material may have a thickness Th. For example, thickness Th may be in the range of 0.5 millimeters to 1.1 millimeters. In some embodiments, thickness Th may be in the range of 0.6 millimeters to 1.0 millimeter. In some embodiments, thickness Th may be in the range of 0.7 millimeters to 0.9 millimeters. In some embodiments, thickness Th may be about 0.8 millimeters or any other suitable thickness. Material 420, which may be made of any suitable material for forming a housing component, such as metal flat stock, may additionally be formed from stainless steel or aluminum. The type of aluminum may typically be balanced with future processing steps so as to allow proper metal forming without ripping and tearing, and without creating flow marks, as well as to provide needed rigidity and strength for a housing component. In essence, the material may be soft enough to forge, but strong enough to be an enclosure. In one example, 5350 aluminum may be used.

As shown in FIG. 16A, material portion 420 may be put through a draw (e.g., a deep draw). A draw portion 442, which may be positioned against an external surface 421 of portion 420, may be drawn in the direction of arrow R toward a draw portion 444, which may be positioned against an internal surface 423 of portion 420, thereby shaping material portion 420 into the curved shape of housing component 420 of FIG. 16B. In other embodiments, material portion 420 may remain substantially flat and may serve as a housing component without being drawn into a curved shape.

Figure 16B:
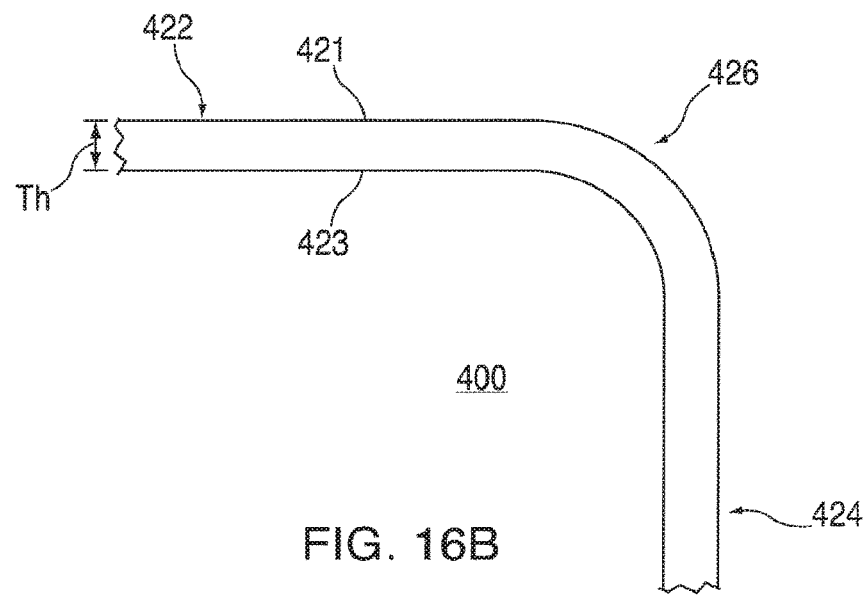

FIG. 16B is a cross-sectional view showing material portion 420 as a curved housing component 420, and particularly as having a front wall 422 and a side wall 424 after the draw. As shown, intersection or edge or corner 426 where front wall 422 and side wall 424 meet may be somewhat rounded. Although in other embodiments, this intersection may be of any other suitable shape.

Figure 16C:
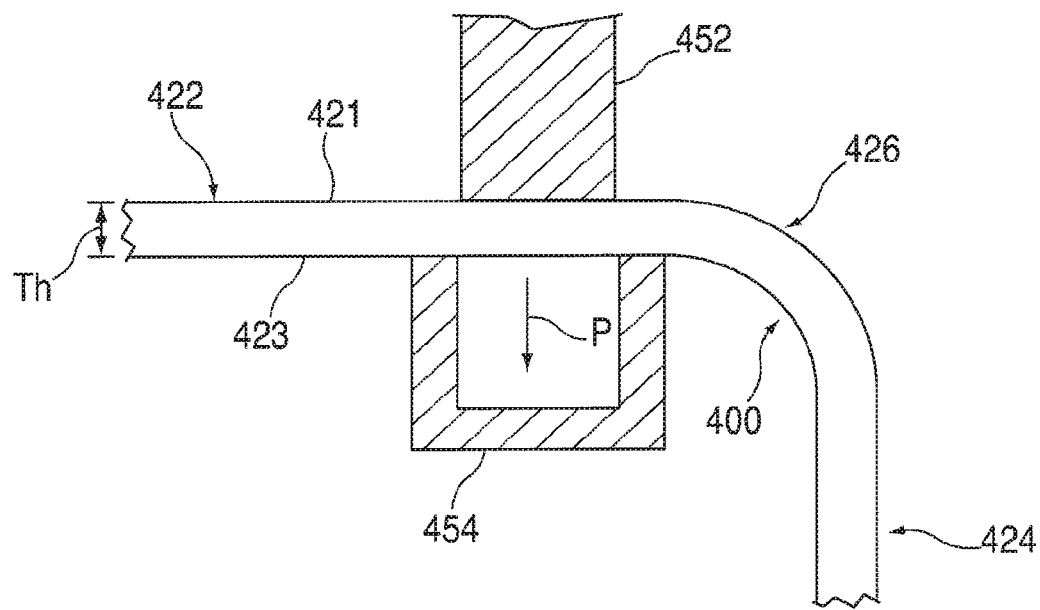
Figure 16D:
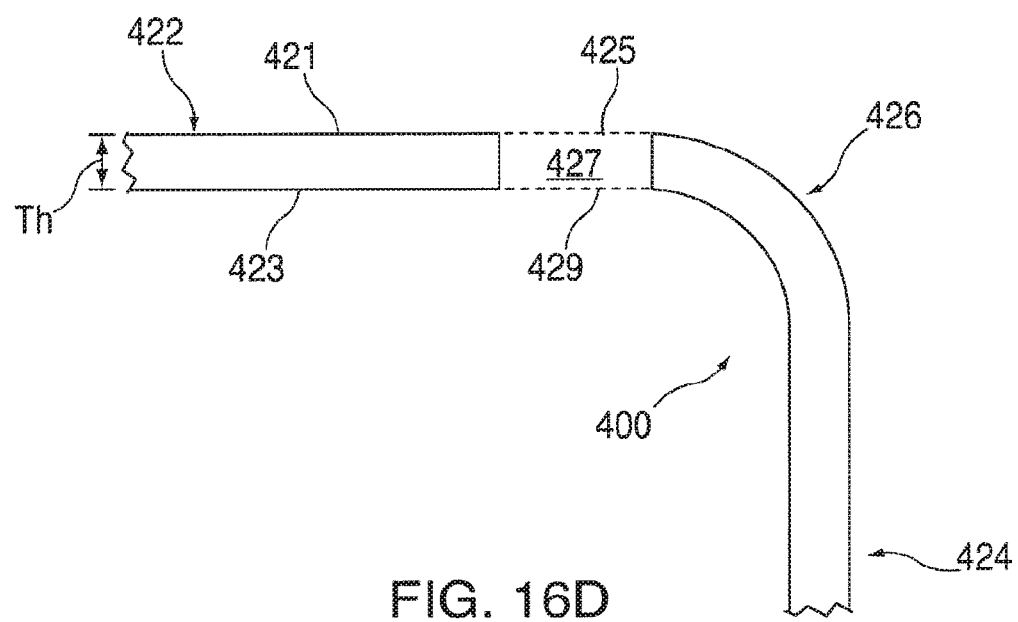

FIG. 16C is a cross-sectional view showing housing component 420 being put through a punching press. A first punching portion 452, which may be positioned against external surface 421 of housing component 420, may be punched in the direction of arrow P toward a second punching portion or die 454, which may be positioned against internal surface 423 of housing component 420. This punching process may be done once, or may be repeated multiple times using punching portions 452 and 454 of various shapes and sizes, until the punching process forms a passageway 427 through housing component 420, between an opening 425 in external surface 421 and an opening 429 in internal surface 423, as shown in FIG. 16D. Although punching portions 452 and 454 are shown in FIG. 16C to be positioned about portions of front wall 422 of housing component 420 for forming passageway 427, punching portions 452 and 454 may be positioned anywhere along housing component 420 (e.g., about portions of side wall 424 or about portions of interface 426) for forming passageway 427 therethrough.

Figure 16E:
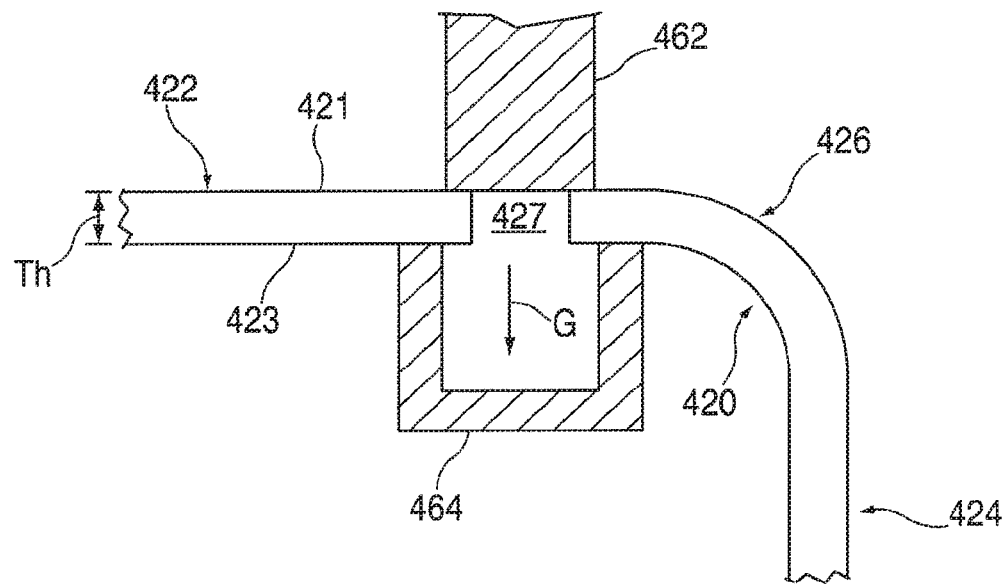

FIG. 16E is a cross-sectional view showing housing component 420 being put through a forging press. A first forging portion 462, which may be positioned against external surface 421 of housing component 420 at opening 425 of passageway 427, may be forged in the direction of arrow G toward a second forging portion or die 464, which may be positioned against internal surface 423 of housing component 420 at opening 429 of passageway 427. This forging process may help increase the length of passageway 427 between openings 425 and 429, as shown by length L of passageway 427 of forged housing component 420 of FIG. 16F. A first portion of the material about external opening 425 may be forged in the direction of arrow G to extend the length of passageway 427 away from external surface 421.

Figure 16F:
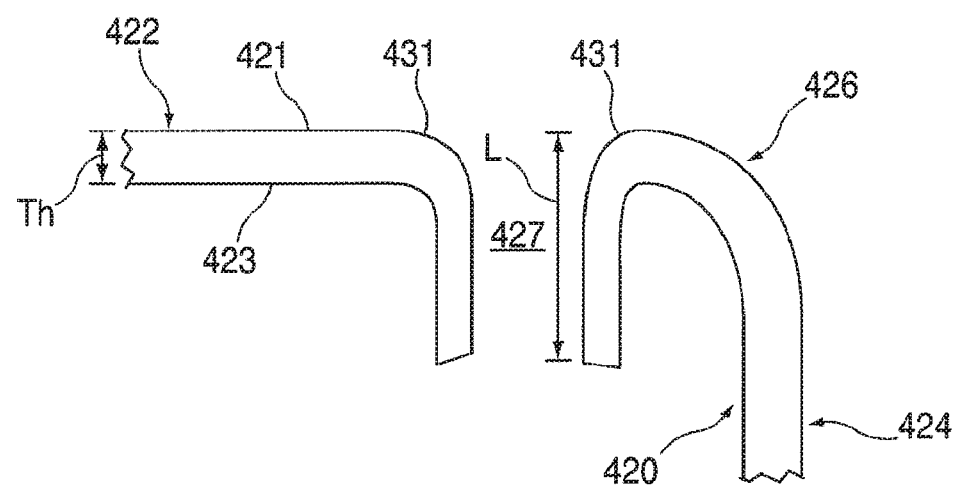

As shown in FIG. 16F, this forging process may form or help increase length L of tubular passageway 427 formed through housing component 420 and extending between external surface 421 and internal surface 423. Generally, the forging technique may include applying a force on the material of the housing component about the openings of passageway 427 at external surface 421 of housing component 420. Material from external surface 421, about opening 425 punched through external surface 421, may be forced downwardly in the direction of arrow G during the forging operation, internal to housing component 420, such that the material is stretched to form portions of the internal surfaces defining tubular passageway 427. This may be referred to as forging forward. The force may be a continuous force or it may be an intermittent hammering force. The number of operations as well as the parameters associated with the forging process may typically be selected to prevent flow marks and tearing, which can occur during a forging process.

Figure 16G:
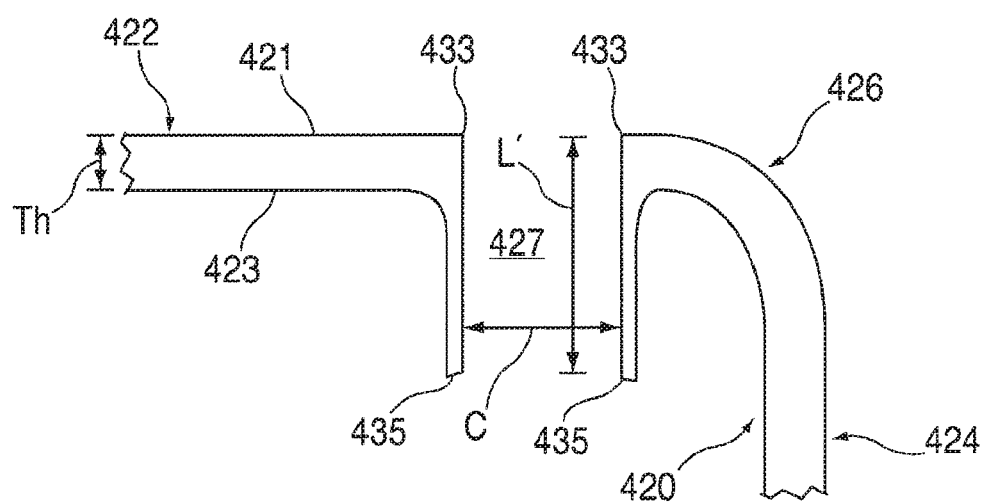

FIG. 16G shows housing component 420 after a machining process that alters the geometry of housing component 420 and, thus, the geometry of tubular passageway 427. Housing component 420 may be machined to further sharpen one or more edges at the openings or ends of the tube (e.g., at external surface 421 of housing component 420 about the opening to passageway 427 formed therethrough). In one embodiment, housing component 420 may be forged to create rounded edges 431 about the opening of tube 427 at external surface 421 (e.g., as shown in FIG. 16F), such that housing component 420 may then be machined to have some of the material at the external opening of tube 427 and along at least portions of length L of tube 427 removed, as shown in FIG. 16G. The machining process may, therefore, create one or more sharp edges 433 (e.g., right angles) on external surface 421 of housing component 420 at the interface between external surface 421 and the material now defining the internal surfaces of tubular passageway 427.

As shown in FIG. 16G, housing component 420 may alternatively or additionally be machined along length L of tubular passageway 427 to create the final cross-sectional area or diameter of the tube as it extends inwardly from external surface 421. The final cross-sectional size or diameter of the tube may have a size C. For example, cross-section C may be in the range of 5.0 millimeters to 15.0 millimeters. In some embodiments, cross-section C may be in the range of 7.0 millimeters to 13.0 millimeters. In some embodiments, cross-section C may be about 10.0 millimeters, or any other suitable size.

Moreover, as shown in FIG. 16G, housing component 420 may additionally or alternatively be machined across tubular passageway 427 at its end 435 opposite to the opening defined by edges 433 in external surface 421 so as to define the final length L' of tubular passageway 427. Final length L' of tube 427 may be relatively large as compared to thickness Th of the material sheet forming housing component 420. For example, final length L' of tube 427 may be in the range of 2.0 millimeters to 4.0 millimeters. In some embodiments, final length L' may be in the range of 2.5 millimeters to 3.5 millimeters. In some embodiments, final length L' may be about 3.0 millimeters or any other suitable length. In some embodiments, when viewed by a user external to the electronic device, the thickness of the material forming housing component 420 may appear to be equal to final length L' of tubular passageway 427, as that may be the only portion of housing component 420 visible to the user that is not along external surface 421 of housing component 421. This may provide the user with the sense that housing component 421 is more rigid than the user might otherwise believe if able to see the true material thickness Th of housing component 420.

One or more holes may be formed at least partially through a surface of any of the previously mentioned housing components for providing an I/O interface, such as that described in U.S. Published Patent Application No. 2008/0084404, entitled "Invisible, Light-Transmissive Display System," and U.S. Published Patent Application No. 2008/0024470, entitled "Invisible, Light-Transmissive Display System," each of which is hereby incorporated by reference herein in its entirety.

Figure 17:
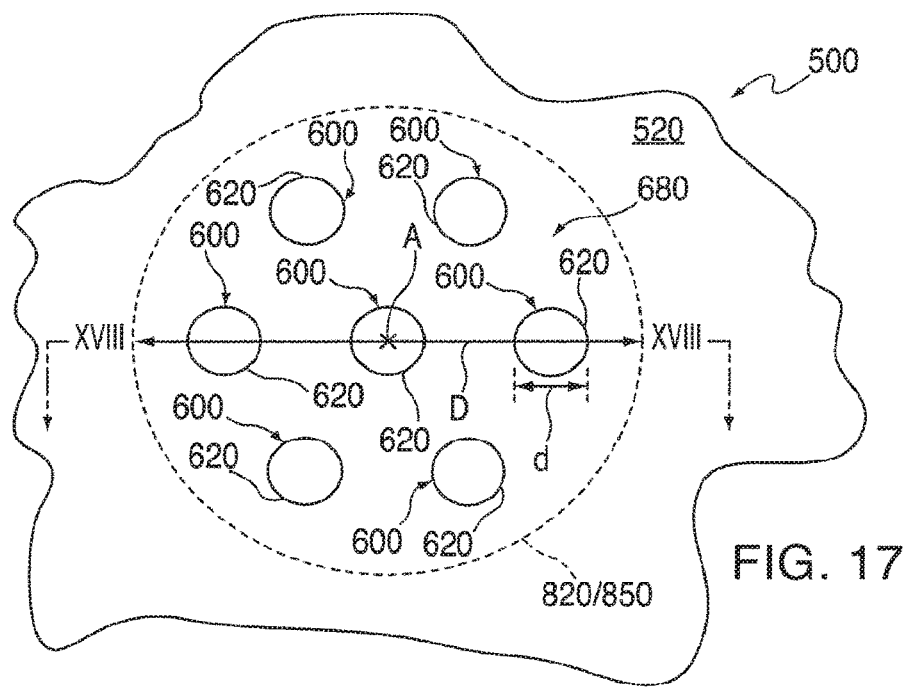
FIG. 17 is an enlarged view of the outer surface of a portion of a housing component of an electronic device, in accordance with some embodiments of the invention.
Figure 18:
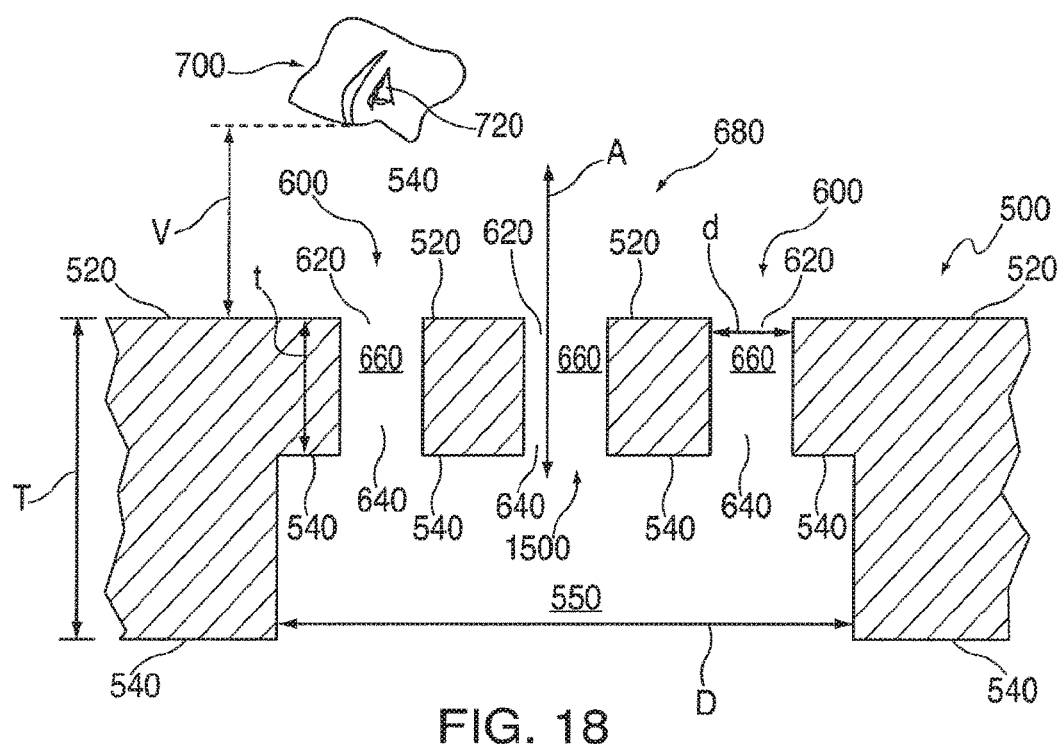
FIG. 18 is a cross-sectional view of the portion of the housing component of FIG. 17, taken from line XVIII-XVIII of FIG. 17.

For example, as shown in FIGS. 17 and 18, one or more holes 600 may be provided through a portion 500 of a housing component. Housing component portion 500 may be any portion of any housing component described herein, including, but not limited to, a top wall (e.g., top wall 16 of FIG. 1), a front wall or chin (e.g., front wall 54 or chin portion 72 of FIGS. 2-9), a rear cover (e.g., rear cover 89 of FIG. 10), and an opaque layer of material or coating (e.g., coating 92 of FIG. 10), for example.

Each hole 600 may be provided between an outer surface 520 and an opposite or inner surface 540 of portion 500. Two or more holes 600 may form a collection or pattern 680 of neighboring holes 600 on outer surface 520 of portion 500. Each hole 600 may be defined by an outer opening 620 in outer surface 520, an inner opening 640 in inner surface 540, and a hollow passageway 660 extending therebetween.

Portion 500 may be made of any suitable material that may retain the structural integrity of the housing component including, for example, metal (e.g., 6063 aluminum) and plastic. Portion 500 of the housing component may be provided with an overall thickness T. In some embodiments, thickness T may be in the range of 0.5 millimeters to 5.5 millimeters. In some embodiments, thickness T may be in the range of 1.5 millimeters to 4.5 millimeters. In some embodiments, thickness T may be in the range of 2.5 millimeters to 3.5 millimeters. In some embodiments, thickness T may be about 3.0 millimeters.

However, in some embodiments, a cavity 550 may be formed into inner surface 540 of portion 500 at the location where inner openings 640 of holes 600 are to be provided. Cavity 550 may be formed by any suitable process, such as laser ablating, for example. As shown in FIG. 18, for example, cavity 550 may reduce the thickness of portion 500 to a reduced thickness t at the location where inner openings 640 of holes 600 are to be provided. In some embodiments, reduced thickness t may be in the range of 0.2 millimeters to 0.8 millimeters. In some embodiments, reduced thickness t may be in the range of 0.3 millimeters to 0.7 millimeters. In some embodiments, reduced thickness t may be in the range of 0.4 millimeters to 0.6 millimeters. In some embodiments, reduced thickness t may be about 0.5 millimeters.

The formation of cavity 550 may facilitate the formation of holes 600 by reducing the thickness of portion 500 from thickness T to reduced thickness t at the location where inner openings 640 of holes 600 are to be provided, and thereby reducing the amount of material of portion 500 to be excavated during the process of creating holes 600. However, it is to be understood that, in certain embodiments, the formation of cavity 550 may not appreciably improve the overall efficiency or speed of manufacturing holes 600 through portion 500. For example, when thickness T of portion 500 is not particularly thick (e.g., on the order of up to about 0.7 millimeters or so), the additional time and effort required to manufacture holes 600 may be less than the additional time and effort required to first form cavity 550. In such a case, it may be more efficient and economical to omit the cost and delay associated with forming cavity 550 before creating holes 600. For example, cavity 550 may be formed after creating holes 600.

In one embodiment, one or more holes 600 may be formed by creating a hollow passageway in portion 500 between an outer opening in outer surface 520 and an inner opening in inner surface 540 such that substantially all sides of the passageway are parallel with an axis that is substantially perpendicular to outer surface 520 and substantially in the center of pattern 680. For example, as shown in FIGS. 17 and 18, the walls of each of hollow passageways 660 in portion 500 between an outer opening 620 in outer surface 520 and an inner opening 640 in inner surface 540 may be substantially parallel with an axis A that is substantially perpendicular to outer surface 520 and substantially in the center of pattern 680.

Figure 18A:
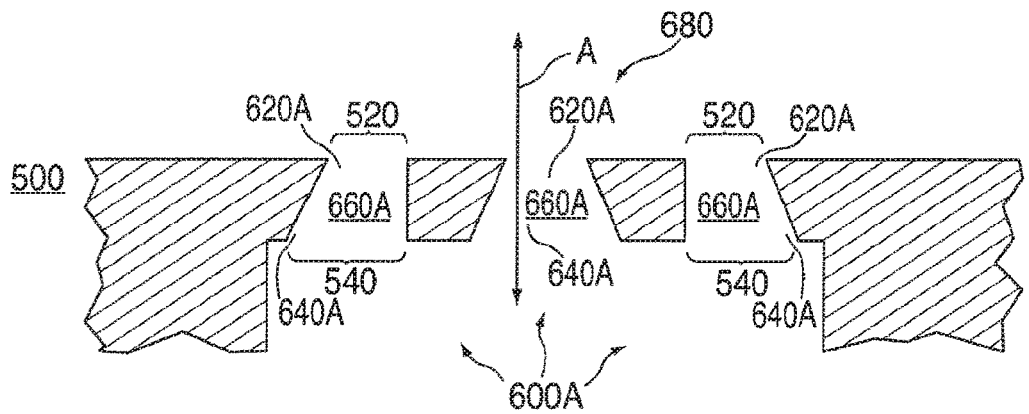
FIG. 18A is a cross-sectional view of a portion of a housing component of an electronic device, similar to FIG. 18, but in accordance with other embodiments of the invention.
Figure 18B:
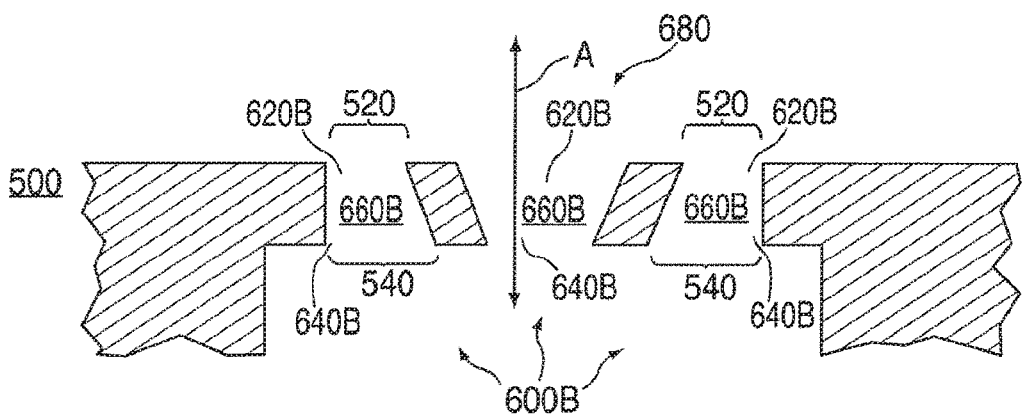
FIG. 18B is a cross-sectional view of a portion of a housing component of an electronic device, similar to FIGS. 18 and 18A, but in accordance with other embodiments of the invention.

In another embodiment, one or more holes may be formed by creating a tapered hollow passageway in portion 500 between outer surface 520 and inner surface 540 such that one or more side portions of the passageway are angled with respect to an axis that is substantially perpendicular to outer surface 520 and substantially in the center of pattern 680. For example, as shown in FIG. 18A, at least one of the walls of each of hollow passageways 660A in portion 500A between an outer opening 620A in outer surface 520A and an inner opening 640A in inner surface 540A may be angled towards axis A (i.e., "angled inwardly"). As shown in FIG. 18B, for example, at least one of the walls of each of hollow passageways 660B in portion 500B between an outer opening 620B in outer surface 520B and an inner opening 640B in inner surface 540B may be angled away from axis A (i.e., "angled outwardly").

Figure 18C:
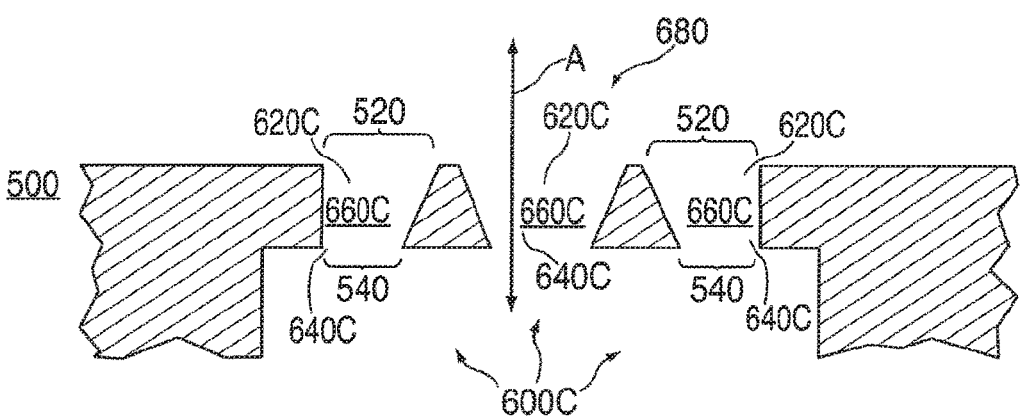
FIG. 18C is a cross-sectional view of a portion of a housing component of an electronic device, similar to FIGS. 18-18B, but in accordance with other embodiments of the invention.

As shown in FIG. 18A, for example, each of holes 600A may be tapered such that the aspect ratio of the cross-sectional area of outer opening 620A to the cross-sectional area of inner opening 640A is less than 1 (i.e., the size of outer opening 620A is less than the size of inner opening 640A). In some embodiments, this aspect ratio may be in the range of 1:6 to 1:2. In some embodiments, this aspect ratio is about 1:3. However, in other embodiments, as shown in FIG. 18C, for example, each of holes 600C may be tapered such that the aspect ratio of the cross-sectional area of outer opening 620C to the cross-sectional area of inner opening 640C is greater than 1 (i.e., the size of outer opening 620C is greater than the size of inner opening 640C). In some embodiments, this aspect ratio may be in the range of 6:1 to 2:1. In some embodiments, this aspect ratio is about 3:1. The angle and aspect ratio of each hole 600 may be varied according to its particular application for providing an I/O interface.

Although shown greatly enlarged in FIGS. 17-18C, one or more of holes 600 may be imperceptible or invisible to the unaided human eye. That is, the cross-sectional area of outer opening 620 of one or more holes 600 may be too small to be resolvable by a user looking at outer surface 520 of portion 500. The average limit of resolution for the unaided adult human eye is about 0.10 millimeters at a viewing distance of about 1 meter. For children, the average limit of resolution is somewhat finer (e.g., 0.04 millimeters at a viewing distance of about 1 meter). Therefore, depending on the anticipated viewer 700 and the anticipated viewing distance V between his or her eye 720 and outer surface 520 of portion 500, the cross-sectional area of outer opening 620 of one or more holes 600 may be selected to be below the limit of resolution of user 700, thereby being imperceptible or invisible to user's eye 720 (see, e.g., FIG. 18).

Thus, as defined herein, the term "invisible hole" may refer to any hole with an outer opening that is smaller than what may be resolvable by an unaided human eye at an anticipated viewing distance. Conversely, it is to be understood that the term "visible hole," as defined herein, may refer to any hole with an outer opening that is large enough to be resolvable by an unaided human eye at an anticipated viewing distance.

Each hole 600 may be formed through portion 500 using one or more suitable techniques, including, but not limited to, laser drilling, laser cutting, laser machining, laser ablating, electron beam machining, electro-discharge machining ("EDM"), chemical milling, metal injection molding, conventional drilling, and combinations thereof. The one or more techniques used may depend on the size and shape of the desired hole 600 and the size and material of portion 500, for example. In one embodiment, an ultra-violet ("UV") computer numerical controlled ("CNC") laser tool having a 1,000 picometer wavelength laser beam with a focal width (i.e., spot size) of about 0.015 millimeters may be used to form one or more holes 600 in portion 500. In another embodiment, a green or yttrium-aluminium-garnet ("YAG") laser may be used, for example, when forming holes with a larger cross-sectional area (e.g., holes with a diameter or cross-sectional length of 0.045 millimeters or greater).

A tapered hole (e.g., hole 600A, 600B, or 600C) may be formed by a type of trepanning process wherein the orbit of a laser tightens or expands as the laser drills deeper into portion 500, for example. A hole 600 may be formed by percussively excavating an entire passageway (e.g., passageway 660) through portion 500. Alternatively, a hole 600 may be formed by excavating the section of portion 500 about the passageway, between the perimeters of the openings defining the hole (e.g., the section of portion 500 about passageway 660, between the perimeters of openings 620 and 640, in the shape of a hollow cylinder). Then, the remaining material of portion 500 that has been isolated by this excavation may be pushed out of the remainder of portion 500 (e.g., by a jet stream of air), thereby leaving a hole 600. An additional drilling step may then be performed within passageway 660 (e.g., by trepanning) to smooth the inner surface of hole 600.

Figure 19:
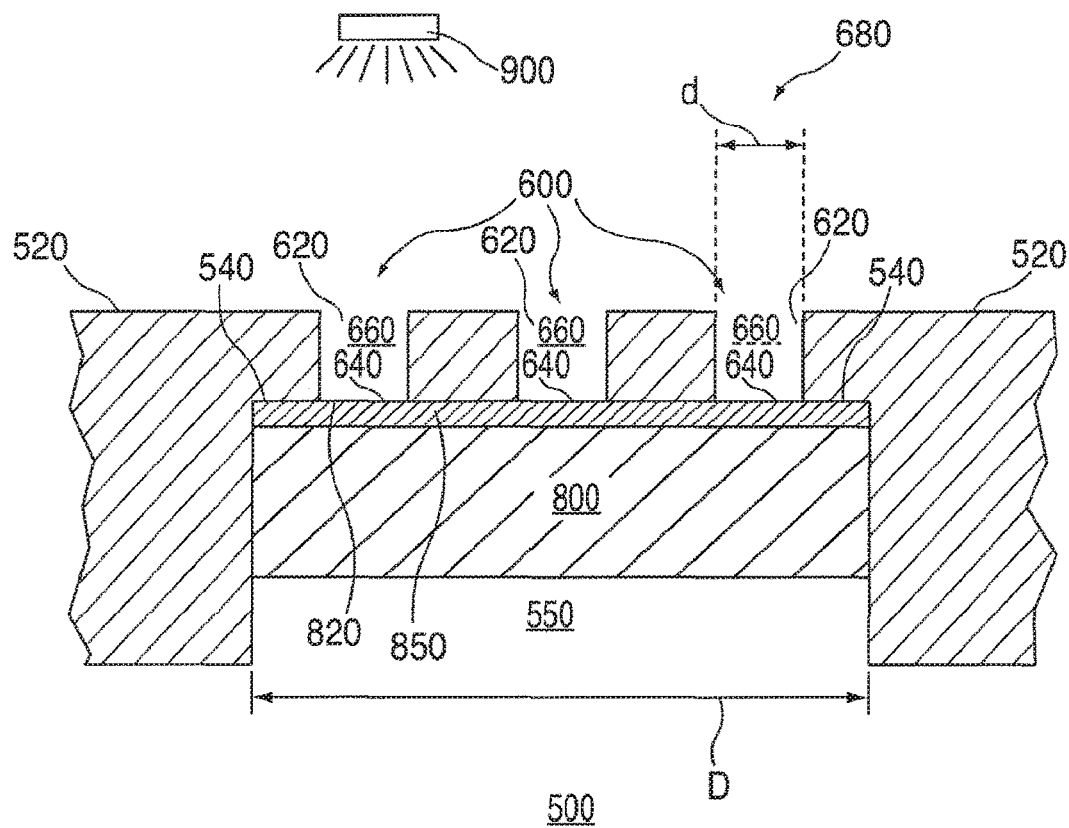
FIG. 19 is a cross-sectional view of the portion of the housing component of FIGS. 17 and 18, similar to FIG. 18, but provided with an I/O component, in accordance with some embodiments of the invention.

An I/O component may be provided adjacent the inner surface of the housing component under one or more holes provided therein for creating an I/O interface. As shown in FIG. 19, for example, an I/O component 800 may be provided adjacent inner surface 540 of portion 500. In one embodiment, I/O component 800 may be positioned such that an outer surface 820 of I/O component 800 faces an inner opening 640 of one or more holes 600 in portion 500. If portion 500 includes a cavity 550, cavity 550 may be sized such that I/O component 800 fits at least partially therein.

I/O component 800 may be any component suitable for transmitting and/or receiving information through one or more holes 600 proximal thereto. A minimum aspect ratio of the total cross-sectional area of the openings of holes 600 formed through portion 500 with respect to the total cross-sectional area or surface area of the active portion of I/O component 800 may be carefully designed to meet the performance specifications of that particular I/O component.

For example, in one embodiment, I/O component 800 may be a microphone that is capable of receiving sound waves transmitted from a source external to the housing component (e.g., external source 900) through one or more holes 600. The minimum aspect ratio of the combined total cross-sectional area of outer openings 620 of holes 600 with respect to the total surface area of the active portion of microphone I/O component 800 (e.g., the total surface area of the transducer or sensor of microphone 800 used to receive sound waves) may be chosen to meet specific performance requirements of microphone 800. In some embodiments, this minimum aspect ratio may be in the range of 10% to 30%. In some embodiments, this minimum aspect ratio may be in the range of 15% to 25%. In some embodiments, this minimum aspect ratio may be about 18.4%.

As shown in FIG. 19, for example, microphone I/O component 800 may include an active portion 850 that spans all of outer surface 820. Moreover, as shown in FIG. 19, active portion 850 and outer surface 820 of I/O component 800 may also span all of inner surface 540 of portion 500 defined by cavity 550. In this embodiment, in which holes 600 may be utilized to pass sound waves from external source 900 to I/O component 800 configured as a microphone, each hole 600 may be provided with a circular outer opening 620 having a diameter d (see, e.g., FIGS. 17-19), for example. Moreover, cavity 550 may be formed within portion 500 as a cylinder having a diameter D (see, e.g., FIGS. 17-19) and, therefore, active portion 850 of microphone 800 may also be cylindrical with a diameter D.

In this particular illustrative embodiment, seven equally shaped holes 600 have been provided through portion 500 as pattern 680. Therefore, in order to meet specific performance specifications of microphone 800, the combined cross-sectional area of all seven holes 600 in pattern 680 must be at least a specifically chosen percentage of the surface area of active portion 850 (i.e., have a specifically chosen aspect ratio). For example, in one embodiment, if diameter D of active portion 850 is 1.5 millimeters and if the minimum required aspect ratio of microphone 800 is 18.4%, each of the seven holes 600 of pattern 680 may be formed with an outer opening 620 having a diameter d equal to about 0.25 millimeters.

It is to be understood, that the foregoing is just illustrative, and that active I/O component active portion 850, cavity 550, pattern 680, and each one of holes 600 and its openings 620 and 640 may be formed of any suitable size and shape, including, but not limited to, triangular, rectangular, elliptical, etc. Moreover, pattern 680 may be formed of any suitable number of holes 600, including just one hole, for example. Each hole 600 in pattern 680 may be separated from other holes 600 in pattern 680 by any suitable distance, depending on the size of pattern 680 and the function of holes 600 with respect to an associated I/O component 800.

For example, in another embodiment, I/O component 800 may include one or more light sources capable of transmitting light through one or more holes 600 towards a user or other entity external to the housing component. Alternatively, I/O component 800 may include one or more receptors that may be sensitive to visible light received through one or more holes 600 from an entity external to the housing component for providing ambient light sensing ("ALS"), for example. I/O component 800 may include one or more receptors that may be sensitive to infra-red light ("IR") received through one or more holes 600 from an entity external to the housing component for receiving IR control signals from a remote control transmitter, for example. I/O component 800 may also be configured as an antenna, a proximity detector, a motion detector, or any other suitable I/O device that may transmit and/or receive information via one or more holes 600.

While there have been described apparatus and methods for producing various housing components of electronic devices, it is to be understood that many changes may be made therein without departing from the spirit and scope of the invention. It is also to be understood that various directional and orientational terms such as "front" and "back" and "rear," "left" and "right," "top" and "bottom," "side" and "edge" and "corner," "height" and "width" and "depth," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Those skilled in the art will appreciate that the invention can be practiced by other than the described embodiments, which are presented for purposes of illustration rather than of limitation, and the invention is limited only by the claims which follow.

What is claimed is:

1. An enclosure for an electronic device, comprising: a continuous metal component formed from a metal sheet, comprising:
    a housing sidewall enclosing an internal volume, the housing sidewall having a generally uniform material thickness and defining a port, wherein:
    the port is defined by a port sidewall that extends into the internal volume a distance that is greater than the generally uniform material thickness of the housing sidewall and that has a thickness that is less than the generally uniform material thickness; and
    the housing sidewall and the port sidewall define a sharp corner where the port sidewall meets an external surface of the housing sidewall.

2. The enclosure of claim 1, wherein:
    the enclosure further comprises:
        a front surface integrally formed with the housing sidewall and defining an opening; and
        a recessed portion within the opening below the front surface;
    the recessed portion is configured to secure a display element of the electronic device to the enclosure such that the display element is substantially aligned with the front surface;
    the enclosure is configured to secure a processing element of the electronic device within the internal volume; and
    the processing element is configured to display an output of the electronic device using the display element.

3. The enclosure of claim 1, wherein a thickness of the housing sidewall at the port is less than the generally uniform material thickness.

4. The enclosure of claim 1, wherein a thickness of the port sidewall tapers along the distance.

5. The enclosure of claim 1, wherein a portion of the port sidewall observable through the port is configured to increase an apparent thickness of the enclosure.

6. The enclosure of claim 1, wherein the port is configured to receive an electrical connector for a cable.

7. The enclosure of claim 1, wherein the port is formed by punching an opening through the housing sidewall and forging a portion of the housing sidewall into the internal volume.

8. An enclosure for an electronic device, comprising:
    a sidewall having a generally uniform thickness with an interior surface that defines an interior cavity, the sidewall including a thinned region having a thickness that is less than the generally uniform thickness of the sidewall and defining an internal recess within the interior surface; and
    an array of visually-imperceptible holes extending through the sidewall at the thinned region, each hole having a diameter of less than 0.1 mm, wherein:
    the internal recess is configured to receive an input/output component of the electronic device.

9. The enclosure of claim 8, wherein the internal recess comprises a size and a shape corresponding to a size and a shape of the input/output component.

10. The enclosure of claim 8, wherein the internal recess substantially surrounds a sidewall of the input/output component.

11. The enclosure of claim 8, wherein:
    the sidewall defines a substantially planar outer surface; and
    the array of visually-imperceptible holes extend through the sidewall perpendicular to the substantially planar outer surface.

12. The enclosure of claim 8, wherein at least one of the array of visually-imperceptible holes is defined by a tapered surface extending through the thickness of the sidewall.

13. The enclosure of claim 8, wherein the input/output component is one of a microphone or a speaker.

14. The enclosure of claim 8, wherein the array of visually-imperceptible holes are configured to transmit an audio signal generated by the input/output component through the sidewall.

15. An enclosure for an electronic device, comprising:
    a continuous metal component formed from a single sheet and defining an internal volume configured to receive electrical components, comprising:
        a first sidewall;
        three or more visually-imperceptible holes arranged in a radially symmetric pattern and extending through the first sidewall; and
        a second sidewall adjoining the first sidewall at a substantially sharp corner, wherein
    at least one of the first sidewall or the second sidewall includes a machined surface positioned along the substantially sharp corner.

16. The enclosure of claim 15, wherein the machined surface is formed by machining a protrusion of the continuous metal component where the first and second sidewalls meet.

17. The enclosure of claim 16, wherein the protrusion is formed by extruding a bent corner of the continuous metal component using a forging process.

18. The enclosure of claim 15, wherein the substantially sharp corner is configured to increase an apparent thickness of the continuous metal component such that the enclosure appears to be a portion of a single, solid core of metal material.

* * * * *